United States Patent
Hosogai et al.

(10) Patent No.: US 6,216,342 B1
(45) Date of Patent: Apr. 17, 2001

(54) METHOD FOR FABRICATING A MATRIX SWITCHBOARD AND CONNECTION PIN

(75) Inventors: Masao Hosogai; Setuo Kojima; Hitoshi Yokemura; Rie Takada; Hiroyuki Otaguro; Takayuki Ashida; Toshio Abe, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/209,459

(22) Filed: Dec. 11, 1998

Related U.S. Application Data

(62) Division of application No. 08/671,618, filed on Jun. 28, 1996, now Pat. No. 5,886,309.

(30) Foreign Application Priority Data

Nov. 2, 1995 (JP) .................................................. 7-286219

(51) Int. Cl.⁷ ...................................................... H01K 3/10
(52) U.S. Cl. ................................ 29/852; 29/846; 474/254
(58) Field of Search ............................... 29/852, 853, 851, 29/825, 830, 846; 427/96, 97; 179/254

(56) References Cited

U.S. PATENT DOCUMENTS

| | | |
|---|---|---|
| 3,824,433 | 7/1974 | Newton, Jr. . |
| 3,850,711 * | 11/1974 | Conley ..................................... 427/7 |
| 4,434,321 | 2/1984 | Betts . |
| 4,859,806 | 8/1989 | Smith . |
| 5,017,145 | 5/1991 | Kanai et al. . |
| 5,456,608 | 10/1995 | Rogers et al. . |
| 5,544,004 | 8/1996 | Inagaki et al. . |
| 5,546,655 * | 8/1996 | Feger et al. ............................ 427/97 |
| 5,790,651 | 8/1998 | Suzuki et al. . |

FOREIGN PATENT DOCUMENTS

| | | |
|---|---|---|
| 35 23 804 | 1/1987 | (DE) . |
| 195 24 019 | 10/1996 | (DE) . |
| 623250 | 11/1994 | (EP) . |
| 62-21255 | 1/1987 | (JP) . |

\* cited by examiner

*Primary Examiner*—Carl J. Arbes
(74) *Attorney, Agent, or Firm*—Staas & Halsey LLP

(57) ABSTRACT

A method for fabricating a matrix switch board used for connecting and disconnecting a switching-system line and a subscriber line. The matrix switch board is formed to include a board made of an insulating material, first and second wiring patterns respectively formed on front and back sides of the board so as to cross each other, and through holes provided at cross points of the first and second wiring patterns. A connection pin inserted into at least one of the through holes, electrically connects at least one of the first wiring patterns on the front side and at least one of the second wiring patterns on the back side.

2 Claims, 28 Drawing Sheets

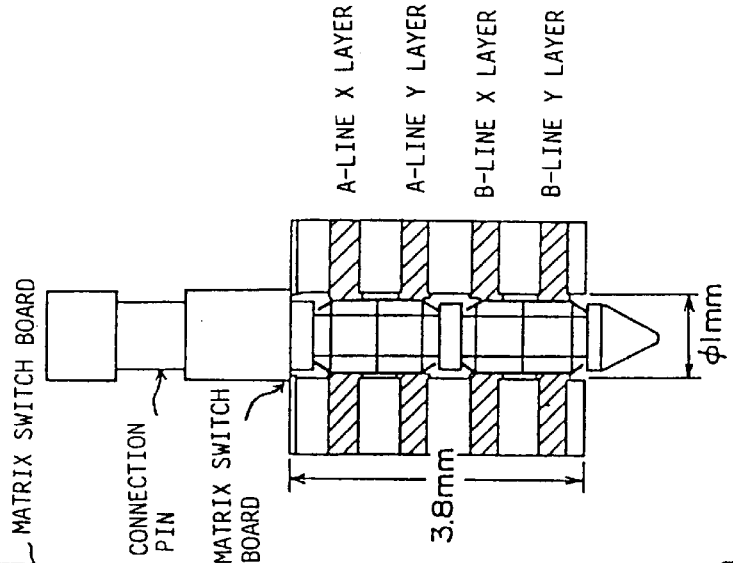
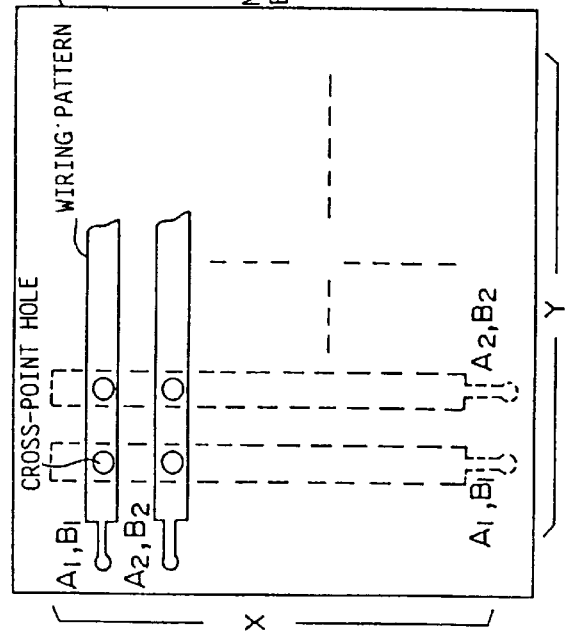
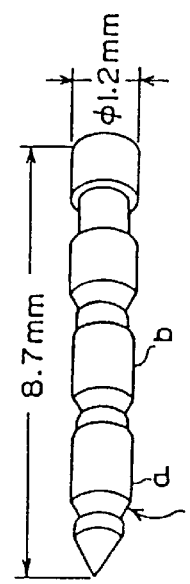
FIG. 3A PRIOR ART
FIG. 3B PRIOR ART
FIG. 3C PRIOR ART

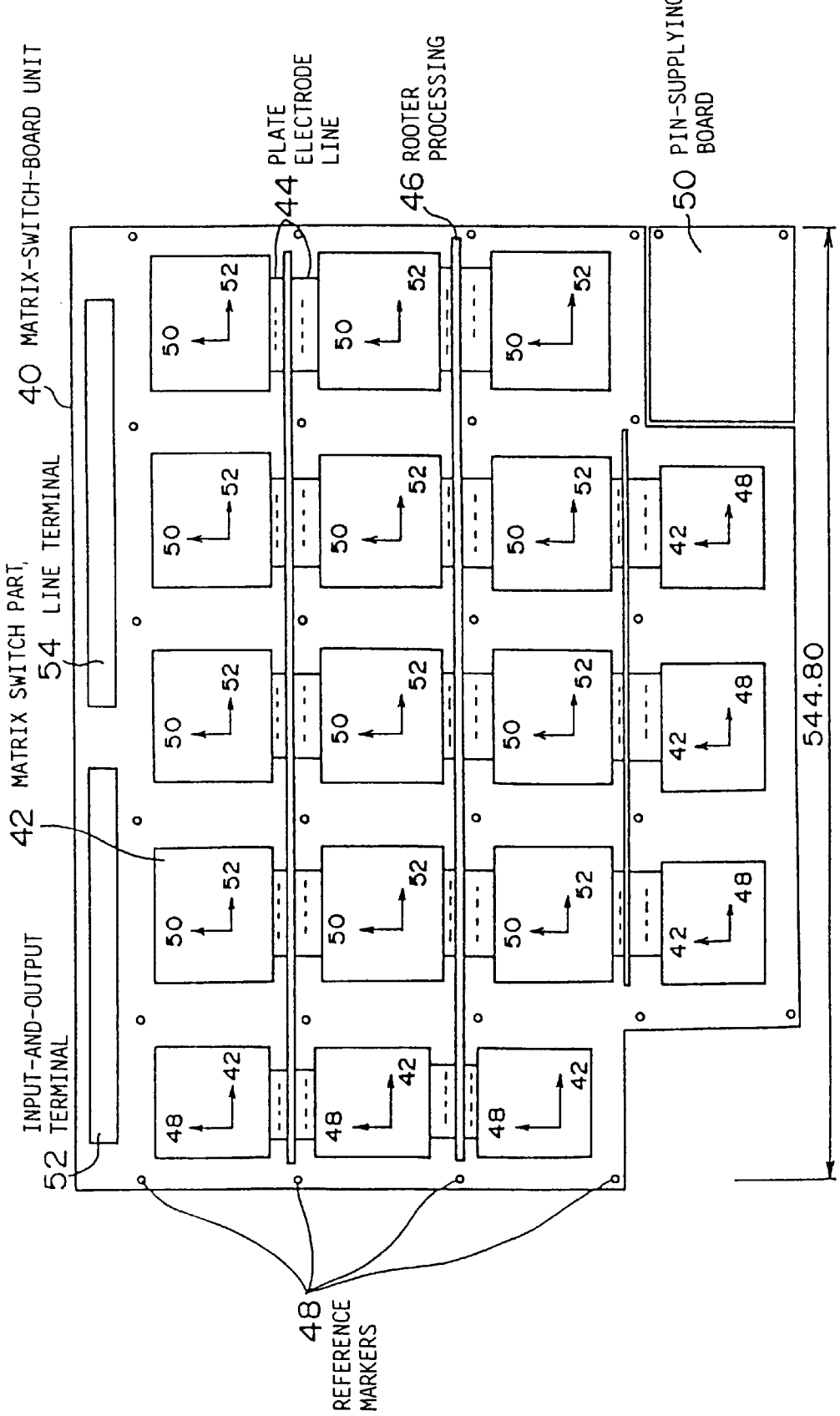

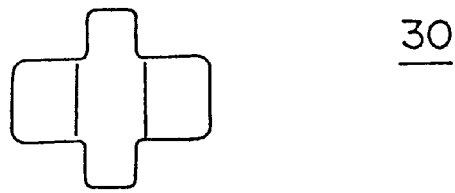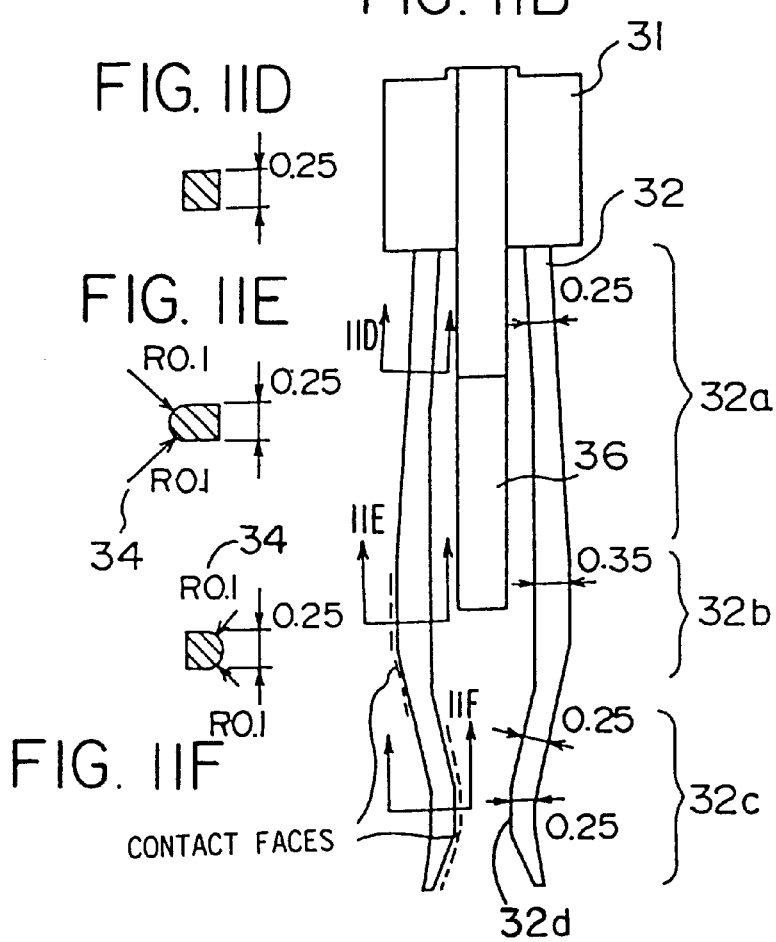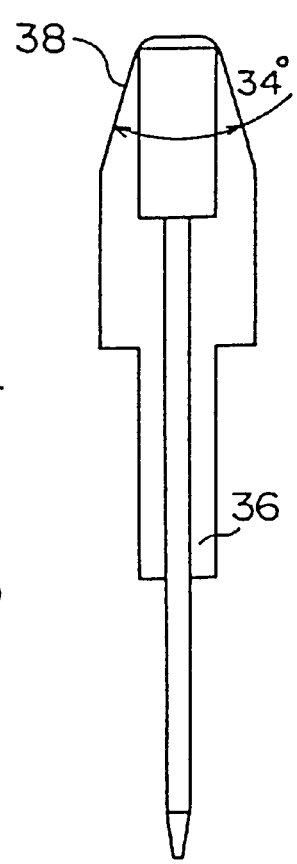

FIG. 13
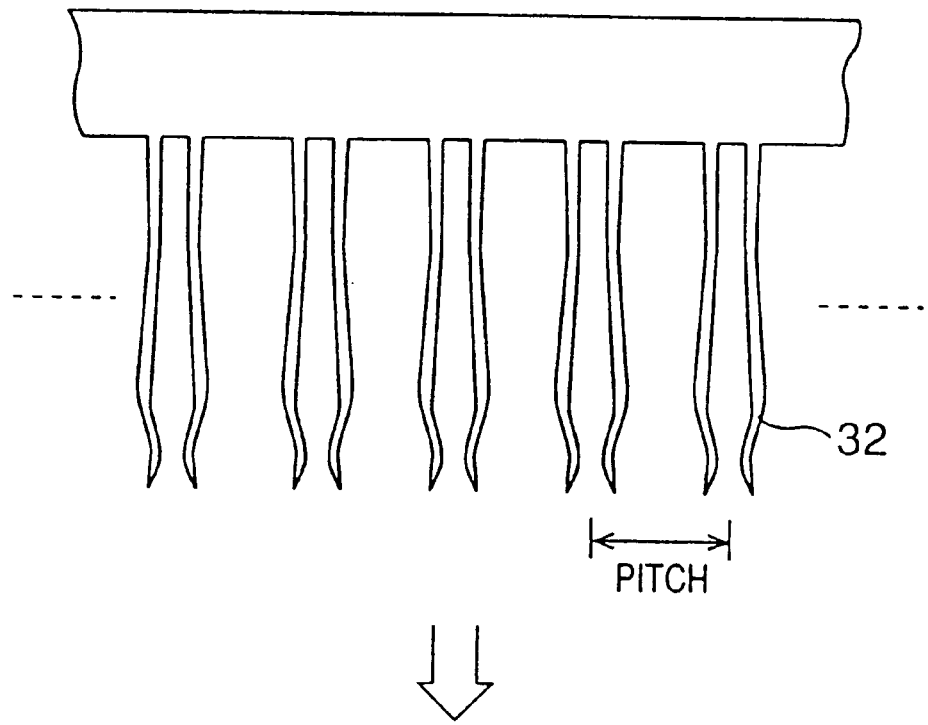
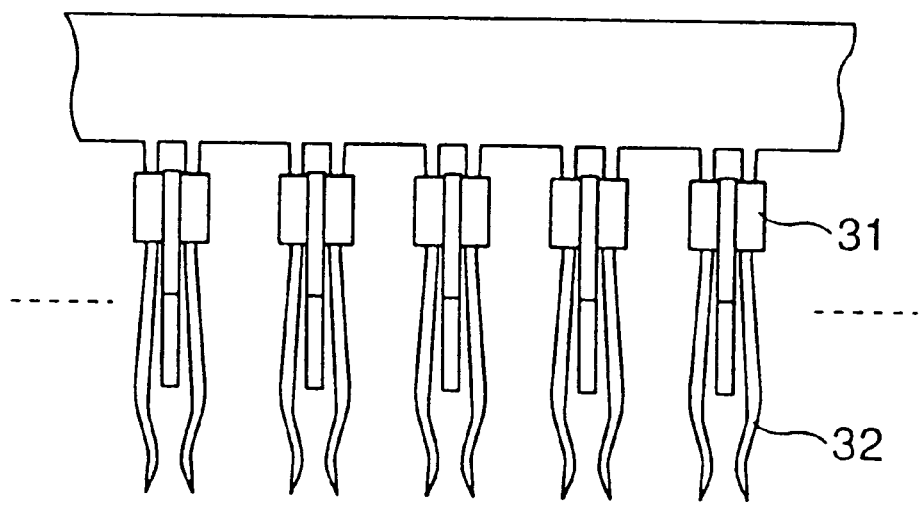

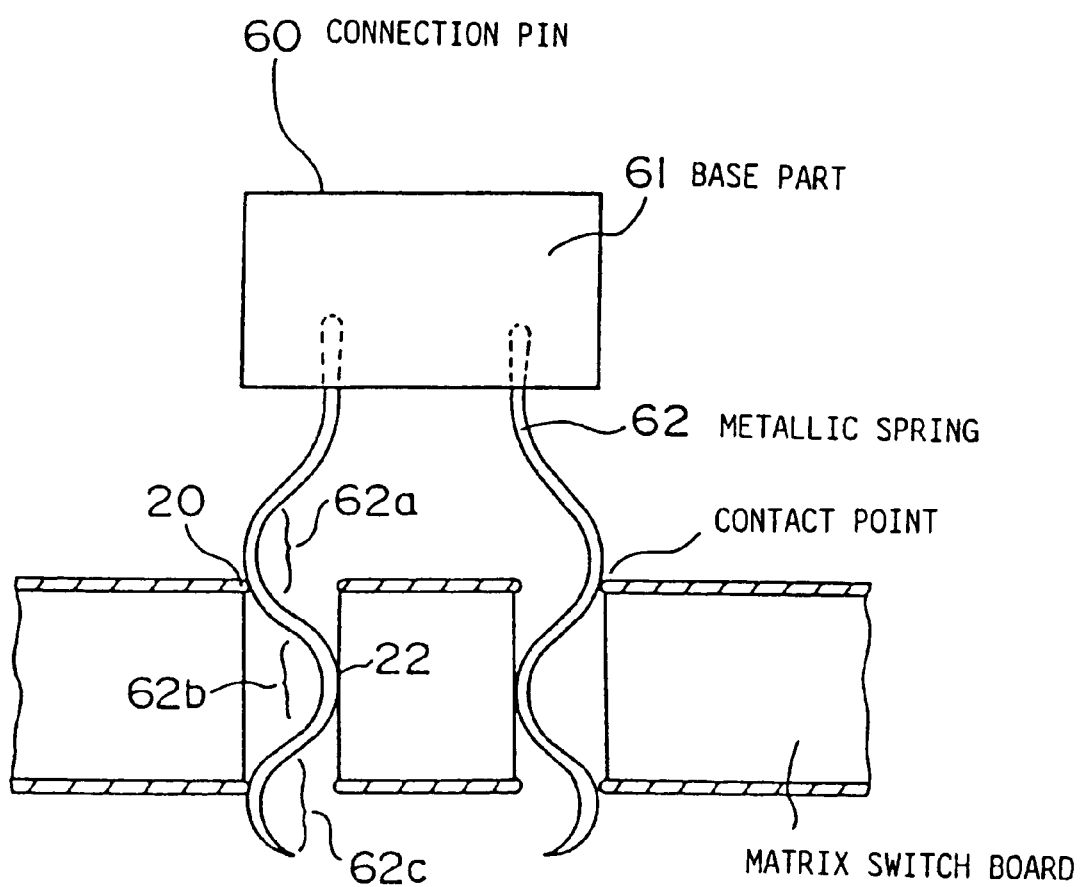

FIG. 15A
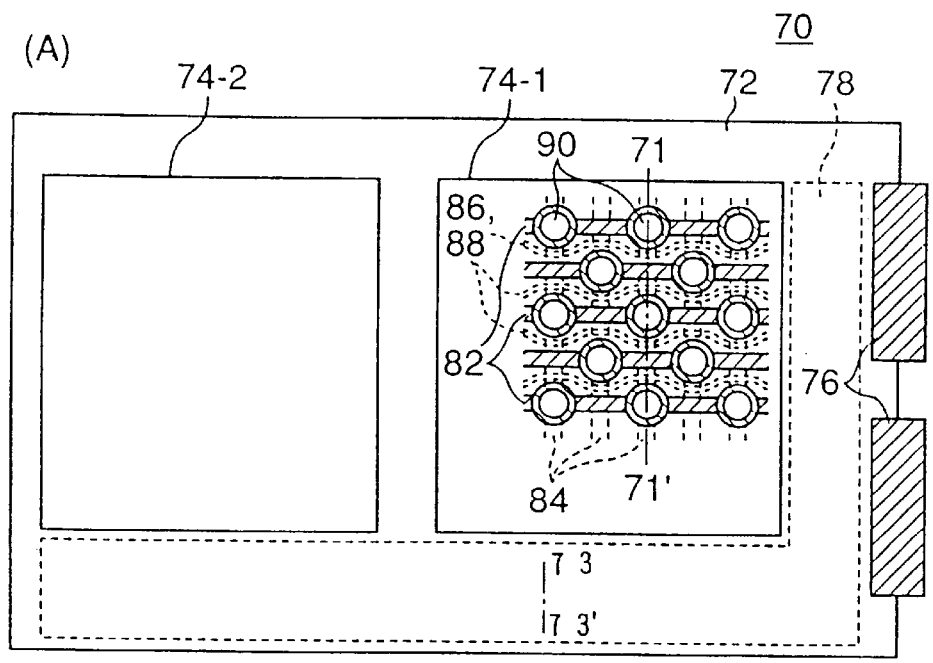
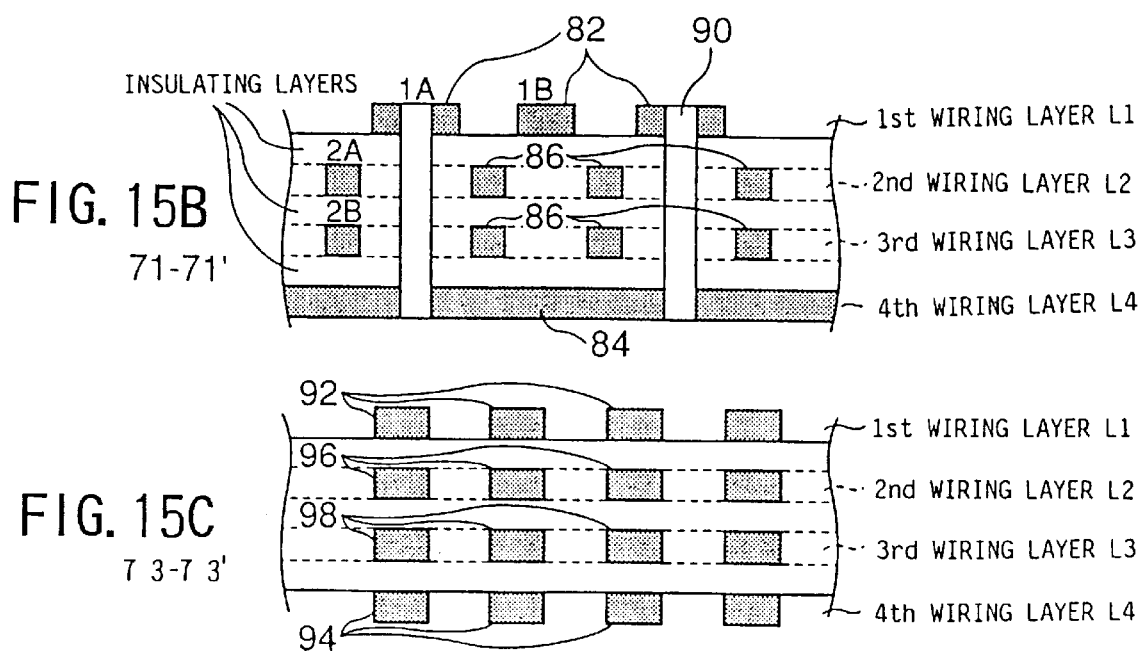

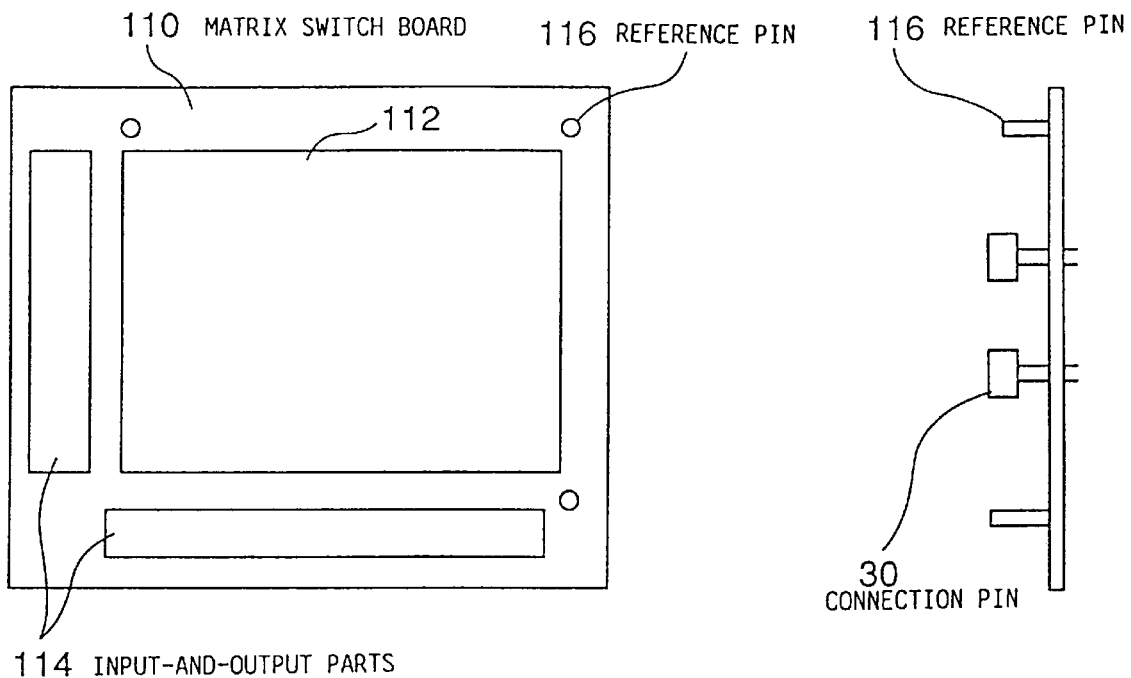
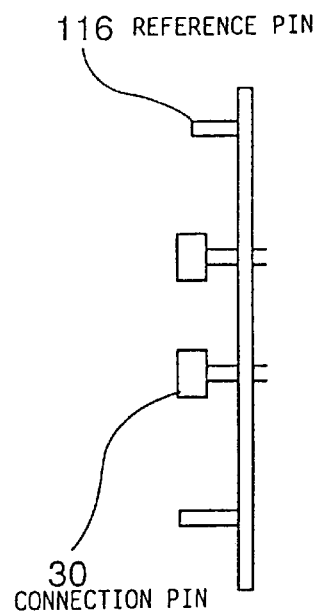
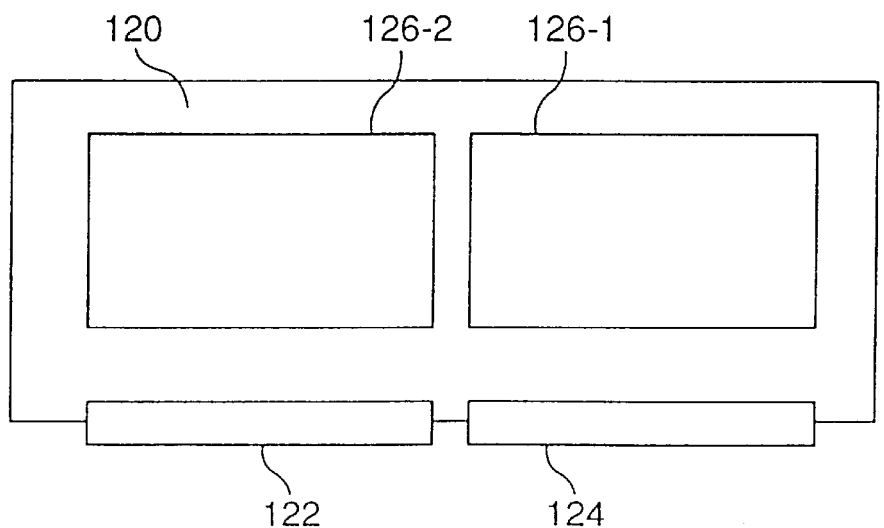

METHOD FOR FABRICATING A MATRIX SWITCHBOARD AND CONNECTION PIN

This application is a Divisional of application Ser. No. 08/671,618, filed Jun. 28, 1996, now U.S. Pat. No. 5,886,309.

BACKGROUND OF THE INVENTION

1. Field of the Invention

The present invention generally relates to a matrix switch board and a connection pin, and more particularly, to a matrix switch board and a connection pin which are used in a main distributing frame (MDF) having a function of flexibly changing a connection between a subscriber and a switching system.

The present invention further is directed to a matrix switch board unit having a plurality of the matrix switch boards, and a method of fabricating the matrix switch board and the connection pin.

2. Description of the Related Art

FIG. 1 shows an illustration for explaining a typical function of a main distributing frame (MDF). The MDF is equipment for flexibly connecting a plurality of subscriber-side terminals and subscriber circuits located in a switching system. In the MDF, when a new subscriber is applied, the new subscriber is connected with the switching system, and when an address or a telephone number of the subscriber is changed, the connection between the subscriber and the switching system is changed. The connection changing may be carried out during an operation of the switching system. For efficient connection changing, the number of subscriber-side terminals (for example, X=3600 terminals) provided in the MDF is commonly larger than that of switching-system-side terminals (for example, Y=2100 terminals).

In the conventional MDF, as shown in FIG. 1, two terminal boards are provided. The subscriber and one terminal board are connected by a pair of cables, and the other terminal board and the switching system are also connected by a pair of cables. Further, the above two terminal boards are manually connected by a maintenance man using jumper wires to connect the subscriber and the switching system. Therefore, for the above-discussed connection work, a specially-skilled engineer is required. There is thus a problem that when the MDF is located in a remote area or an unmanned exchange office of an isolated island, it takes a long time to send the maintenance man, and, as a result, the connection work for a variety of services, for example, telephone service, may not quickly be carried out. Further, since the above connection work is carried out mainly during the operation of the switching system, errorless work is required. Accordingly, it takes a long time for that connection work. To overcome these problems, recently, an automatic MDF has been developed, wherein the jumpering work is carried out by a robot.

FIG. 2 to FIG. 4 show a configuration example of a prior-art automatic MDF. FIG. 2 shows a principle of the prior-art automatic MDF. FIG. 3A to FIG. 3C show configurations of prior-art matrix switch board and connection pin used in the prior-art automatic MDF. More specifically, FIG. 3A shows the configuration of the prior-art matrix switch board, FIG. 3B shows the configuration of the prior-art connection pin, and FIG. 3C shows an illustration indicating a condition in which the connection pin is inserted into the matrix switch board. FIG. 4 shows a configuration of the prior-art automatic MDF.

As shown in FIG. 2, in the prior-art automatic MDF, instead of the terminal board for the jumpering, a matrix switch board (MB) is provided. The matrix switch board is constructed with a multilayer-structure-type board, wherein a plurality of subscriber-side wires X and a plurality of switching-system-side wires Y are arranged in different layers so that the wires X, Y cross at substantially a right angle. At each cross point, a cross-point hole is provided in the board, wherein by inserting a connection pin into the cross-point hole, a desired subscriber-side wire X can be connected to a desired switching-system-side wire Y. In the automatic MDF, an inserting operation of the connection pin is automatically carried out by a robot.

When, for example, in one matrix switch board, 3600 terminals on the subscriber side and 2100 terminals on the switching system side are provided, 7.50-million cross-point holes need to be provided. In this case, robot control is subjected to a large amount of load. Therefore, in practical use, by arranging a plurality of small-sized matrix switch boards in a network-structure formation based on a given rule, substantially the same function is realized. In this method, the number of the cross-point holes may be extremely reduced.

Such a matrix switch board, as shown in FIG. 3A and FIG. 3C, is constructed with a printed wiring board having 4 conductive layers. In general, a connection between the subscriber and the switching system is wired by A-line wires and B-line wires, and for high efficiency, the two wires of each type are simultaneously connected. Therefore, the prior-art matrix switch board has the subscriber-side wires provided with two layers (the A-line X layer and B-line X layer) and the switching-system-side wires provided with two layers (the A-line Y layer and B-line Y layer), wherein the two groups of wires cross at substantially a right angle. At each cross point of these wires, a hole penetrating the printed wiring board is provided. In the prior-art matrix switch board, an interval of a distance between adjacent holes in the printed wiring board is approximately 1.5 mm.

The prior-art connection pin has, as shown in FIG. 3B, two cylindrical connection springs a, b arranged in series in an axial direction. By inserting the connection pin into the cross-point hole of the matrix switch board, as shown in FIG. 3C, both connections between the subscriber-side A line and the switching-system-side A line and between the subscriber-side B line and the switching-system-side B line can simultaneously be wired. The prior-art connection pin has approximately an 8.7-mm length and is approximately 1.2 mm in diameter.

In the prior-art automatic MDF, as shown in FIG. 4, a plurality of matrix switch boards 1 is dimensionally arranged so as to form one flat board. Two such flat boards are arranged on both sides of an apparatus 4 accommodating a robot 3 for inserting a connection pin 2. The robot 3 searches for a designated cross-point hole 5 in the flat board, and inserts the connection pin 2 into the cross-point hole 5. The connection pin 2 mounted in the robot 3 can turn in an opposite-side direction, and can also be inserted into the matrix switch board of the flat board arranged on the opposite side. Because the connection between the subscriber-side line and the switching-system-side line is carried out mainly during the operation of the switching system, one connection pin 2 is inserted for one transmission line to be connected. Since in the above-mentioned automatic MDF, a plurality of the matrix switch boards is dimensionally arranged, a width of the flat board may be several meters.

However, the above-mentioned prior-art matrix switch board and connection pin have the following disadvantages.

The matrix switch board requires a large number of cross-point holes. However, the number of cross-point holes which are practically used is a part of the total number. Namely, most of the cross-point holes may not be used, but are required for small probability of use. Therefore, for the automatic MDF, reduction of cost for one cross-point hole of the matrix switch board is one of important themes.

Accordingly, in the prior-art matrix switch board, reduction of an arranging pitch and a diameter of the cross-point hole, and reduction of the diameter of the connection pin have been tried. However, for the above-mentioned processes, manufacture precision for a fine structure requires further improvement, and this requirement obstructs cost reduction.

Further, when the wiring patterns for the communication lines are arranged close to each other, a cross talk commonly occurs, wherein a signal transmitted in one communication line leaks to another communication line as noise. In the prior-art four-layer structure matrix switch board shown in FIG. 3A, since the pair of wiring patterns in the subscriber side are simultaneously connected with the pair of wiring patterns in the switching-system side by one connection pin, the pair of wiring patterns in the subscriber side and the pair of wiring patterns in the switching-system side are subsequently arranged in a vertical direction. In such a wiring-pattern structure, there is a problem in that it is difficult to reduce the cross talk between the communication lines provided by the wiring patterns.

Furthermore, the prior-art connection pin needs to have two connection parts. Therefore, it is necessary to fix ring-type connection members to a plastic rod while maintaining a good joint property. Therefore, there is thus a problem in that assembling the connection pin is difficult, and, thus, the cost of the connection pin increases.

SUMMARY OF THE INVENTION

It is an object of the present invention to provide a matrix switch board, a connection pin, and a method of fabricating the matrix switch board and the connection pin. The matrix switch board and the connection pin can readily be fabricated, and the cost of the matrix switch board and the connection pin can be reduced. Further, in the matrix switch board, a cross talk between communication lines may be reduced. This permits the disadvantages described above to be eliminated.

The object described above is achieved by a matrix switch board used for connecting and disconnecting between a switching-system line and a subscriber line, the matrix switch board comprising: a board made of an insulating material; first and second wiring patterns respectively formed on front and back sides of the board so as to cross each other; and through holes provided at cross points of the first and second wiring patterns; wherein when a connection pin is inserted into at least one of the through holes, at least one of the first wiring patterns on the front side and at least one of the second wiring patterns on the back side are electrically connected to each other.

According to the above-mentioned matrix switch board, the matrix switch board may be constructed with a two-layer-structure printed board. The cost of the matrix switch board may be reduced.

The object described above is also achieved by the matrix switch board mentioned above, wherein the through holes are formed at every other cross point in respective directions of the first and second wiring patterns, and when a connection pin having two metallic springs is inserted into two of the through holes, two pairs of connections between the first and second wiring patterns are simultaneously processed.

According to the above-mentioned matrix switch board, the through holes are provided at every other cross point in the direction of the first wiring patterns, and also provided at every other cross point in the direction of the second wiring patterns. The through holes are not consecutively provided at the adjacent cross points, and, thus, the through holes may be provided with high density.

Also, in this wiring pattern structure, a sufficient interval of distance may be provided between the through hole and the adjacent wiring pattern, and between the adjacent wiring patterns. Therefore, these wiring patterns are prevented from unexpectedly being shorted, and, thus, high reliability of insulation of the wiring patterns may be obtained.

Further, although the pitch of the through hole arrangement in the matrix switch board according to the present invention is substantially the same as that in the prior-art matrix switch board, the matrix switch board according to the present invention may be constructed with a cheaper two-layer-structure printed board, and, thus, a cost per one through hole may be reduced.

The object described above is also achieved by a connection pin which connects between first wiring patterns and second wiring patterns formed in different layers on a board when the connection pin is inserted into two through holes provided at cross points of the first and second wiring patterns, the connection pin comprising: a base part made of an insulating material; and two metallic springs fixed to the base part so as to face each other, the metallic springs having: first parts which extend in a substantially straight direction from the base part; second parts which follow the first parts and extend toward each other; and end parts which follow the second parts and extend away from each other; wherein when the connection pin is inserted into the two through holes, two pairs of the first and second wiring patterns are respectively connected, first contact points between the metallic springs and the first wiring patterns are positioned at the first parts of the metallic springs, and second contact points between the metallic springs and the second wiring patterns are positioned at second parts of the metallic springs.

According to the above-mentioned connection pin, when the connection pin is inserted into the through holes, an outside of the first part and an inside of the end part of the connection pin respectively may contact a plated part overhung inside the through hole. Accordingly, by such a simple configuration having the two metallic springs, a positive connection may be maintained. Further, the connection pin enables two pairs of connections between the first and second wiring patterns to simultaneously be performed.

The object described above is also achieved by a connection pin which connects between first wiring patterns and second wiring patterns formed in different layers on a board when the connection pin is inserted into two through holes provided at cross points of the first and second wiring patterns, the connection pin comprising: a base part made of an insulating material; and two metallic springs fixed to the base part so as to face each other, each of the metallic springs having: a first part which bends in a "U"-shape manner and contacts the first wiring pattern at a first contact point; a second part which follows the first part, bends in a "U"-shape manner, and contacts an inside wall of the through hole; and an end part which follows the second part, bends in a "U"-shape manner, and contacts the second wiring pattern at a second contact point; wherein when the connection pin is inserted into the two through holes, two pairs of the first and second wiring patterns are respectively connected.

According to the above connection pin, when the connection pin is inserted into the through holes of the matrix switch board, the first part and the end part may contact plated parts of the through hole, and the second part may contact the inside wall of the through hole. Therefore, the connection pin is supported at three points of the through hole, and, thus, a force is not applied on the base part by the metallic springs fixed thereto. As a result, the base part is prevented from being damaged by the a force from the metallic springs.

The object described above is also achieved by the connection pin mentioned above, wherein the end parts of the metallic springs respectively have a taper structure, and a distance between the end parts of the two metallic springs is substantially the same as a distance between the two through holes where the connection pin will be inserted.

According to the above connection pin, each end part of the metallic spring is processed in a taper shape, and the two end parts are designed so as to be arranged just above the two through holes of the matrix switch board. Therefore, when the connection pin is inserted into the through holes, the taper structure of the end parts is operative as an inserting guide. This operation may reduce inserting mistakes.

The object described above is also achieved by the connection pin mentioned above, wherein each of the metallic springs has a contact part contacting one of the first and second wiring patterns, the contact part being thicker as compared to other parts of the metallic spring.

According to the above connection pin, a thickness of the contact part is designed to be larger. Therefore, when the connection pin is inserted into the through holes, a force produced at a contact face between the metallic spring and the through hole may be absorbed by the metallic spring.

The object described above is also achieved by the connection pin mentioned above, wherein each of the metallic springs has a contact part contacting one of the first and second wiring patterns, the contact part being chamfered.

According to the above connection pin, the contact part contacting the through hole is chamfered. Therefore, a sufficient contact area may be obtained between the metallic spring and a plated part of the through hole. Accordingly, the plated part may not be damaged. As a result, high contacting reliability is expected. Also, when a robot inserts the connection pin into the through hole, the inserting strength of the robot may be reduced.

The object described above is also achieved by the connection pin mentioned above, wherein the base part has a pillar part extending in a downward direction between the two metallic springs, and when the connection pin is inserted into the two through holes, the pillar part restricts an insertion distance of the connection pin.

According to the above connection pin, by providing the pillar part to the connection pin, a limit of the insertion distance of the connection pin may easily be determined. Also, the pillar part may have a function of supporting the connection pin to individually stand when the connection pin is inserted into the through holes.

The object described above is also achieved by the connection pin mentioned above, wherein each of the end parts has, in an area adjacent to the second part, a fourth part in parallel to a center axis of the two metallic springs.

According to the above connection pin, in the area adjacent to the second part, the fourth part is provided in parallel to the inside wall of the through hole. Therefore, even when the connection pin is extracted from the through holes a short distance, the connection pin is prevented from easily falling out of the through holes.

The object described above is also achieved by a method of manufacturing a matrix switch board used for connecting and disconnecting a specified line, the method comprising the steps of: (a) forming through holes at predetermined positions where first and second wiring patterns will be formed on a board on which conductive layers are formed on front and back sides of the board; (b) patterning the conductive layers formed on the front and back sides of the board by using a resist to produce the first and second wiring patterns crossing each other; (c) etching the board patterned in the step (b); and (d) plating the first and second wiring patterns in the through holes to form parts overhanging in a substantially center axis direction of the through hole.

According to the above method, the plated parts overhang inside the through hole and form a point contacting structure. By the above-mentioned simple method, the plated parts may easily be overhung, and an electrical connection with the connection pin may positively be performed.

The object described above is also achieved by a method of manufacturing a connection pin which connects between first wiring patterns and second wiring patterns formed in different layers on a board when the connection pin is inserted into two through holes provided at cross points of the first and second wiring patterns, the connection pin comprising: a base part made of an insulating material; and two metallic springs fixed to the base part so as to face each other, the metallic springs having: first parts which extend in a substantially straight direction from the base part; second parts which follow the first parts and extend toward each other; and end parts which follow the second parts and extend away from each other; the method comprising the steps of: (a) successively forming a plurality of the metallic springs in a reel form; and (b) molding the base part for each of the metallic springs; wherein a pitch of successively forming the connection pins in the reel form is set to integral multiples of the smallest insertion pitch by which the connection pins are inserted into through holes.

According to the above method, a plurality of connection pins is successively formed in the reel form. Therefore, the plurality of connection pins may simultaneously be inserted into a pin-supplying board or a pin-supplying area of the matrix switch board. Accordingly, a large number of connection pins may be efficiently inserted into the pin-supplying area.

The object described above is also achieved by a method of manufacturing a connection pin which connects between first wiring patterns and second wiring patterns formed in different layers on a board when the connection pin is inserted into two through holes provided at cross points of the first and second wiring patterns, the connection pin comprising: a base part made of an insulating material; and two metallic springs fixed to the base part so as to face each other, the metallic springs having: first parts which extend in a substantially straight direction from the base part; second parts which follow the first parts and extend toward each other; and end parts which follow the second parts and extend away from each other; the method comprising a step of forming the metallic springs by drawing patterns of the metallic springs from a metallic plate.

According to the above method, the metallic springs are manufactured by drawing the pattern of the springs from the metal plate. Therefore, a large number of metallic springs may simultaneously be formed, and for each part of the metallic spring, desired thickness and bending angle may flexibly be designed.

The object described above is also achieved by a matrix switch board used for equipment connecting and disconnecting a switching-system-side line and a subscriber-side line, the matrix switch board comprising: a multilayer board, made of an insulating material, including a plurality of wiring layers; a first group of wiring patterns which are horizontally arranged in parallel to each other in one of the plurality of wiring layers in the multilayer board, and used for at least one of the switching-system-side line and the subscriber-side line; and a second group of wiring patterns which are vertically arranged in parallel to each other in different wiring layers in the multilayer board, and used for at least one of the switching-system-side line and the subscriber-side line.

The object described above is also achieved by the matrix switch board mentioned above, further comprising a matrix switch part, the matrix switch part including: first wiring patterns formed as one of the first group of wiring patterns on a front side of the multilayer board; second wiring patterns as one of the second group of wiring patterns on a back side of the multilayer board so as to cross the first wiring patterns; and through holes formed at every other cross point in respective directions of the first and second wiring patterns; wherein: when a connection pin is inserted into at least one of the through holes, at least one of the first wiring patterns on the front side and at least one of the second wiring patterns on the back side are electrically connected to each other; and the second group of wiring patterns are provided between the through holes formed in the matrix switch part.

According to the above-mentioned matrix switch board, the first group of wiring patterns are horizontally arranged in parallel to each other, and the second group of wiring patterns are vertically arranged in the different wiring layers in parallel to each other. In the wiring-pattern structure, cross talk occurring between a line using the first group of wiring patterns and a line using the second group of wiring patterns may be reduced.

The object described above is also achieved by the matrix switch board mentioned above, wherein a thickness of an insulating layer between the wiring layer of the first group of wiring patterns and the wiring layer of the second group of wiring patterns is less than that of an insulating layer between the second group of wiring patterns.

The object described above is also achieved by the matrix switch board mentioned above, wherein the second group of wiring patterns are arranged in the wiring layers positioned in a vertical direction between the first group of wiring patterns.

According to the above-mentioned matrix switch board, cross talk between the lines may further be reduced.

The object described above is also achieved by the matrix switch board mentioned above, further comprising an input part and an output part for connection with an external device, wherein wiring patterns connecting the input part and the matrix switch part are spaced apart from wiring patterns connecting the matrix switch part and the output part by at least one arranging pitch of both the wiring patterns.

According to the above matrix switch board, the wiring patterns for an input signal are spaced apart from the wiring patterns for an output signal by at least one arranging pitch of the wiring patterns. Therefore, in this matrix switch board, cross talk occurring between the wiring patterns for the input signal and the wiring patterns for the output signal may be reduced.

The object described above is also achieved by matrix switch boards used for equipment connecting and disconnecting a switching-system-side line and a subscriber-side line, the matrix switch boards comprising: a first matrix switch board including a matrix switch part connecting-and-disconnecting the lines by inserting-and-extracting a connection pin into-and-from at least one through hole and an input-and-output connector provided in a rear end side on a front side of the board; and a second matrix switch board including a matrix switch part connecting-and-disconnecting the lines by inserting-and-extracting a connection pin into-and-from at least one through hole and an input-and-output connector provided in a rear end side on a back side of the board; wherein wiring patterns of the first and second matrix switch boards are formed so that when the first and second matrix switch boards are viewed from a back board side to which these boards are mounted, terminal arrangements of the two input-and-output connectors of the first and second matrix switch boards are identical to each other.

According to the matrix switch boards, when the first and second matrix switch board are mounted to the back wiring board, the terminal arrangement of the two input-and-output connectors when the connectors are viewed from the back wiring board may be identical to each other. Therefore, the back wiring board may easily be constructed.

The object described above is also achieved by a matrix switch board used for equipment connecting and disconnecting a switching-system-side line and a subscriber-side line by inserting a connection pin into-and-from at least one through hole, the matrix switch board comprising: a matrix switch part including two wiring patterns formed in different layers so as to cross each other and through holes formed at cross points of the two wiring patterns; and a connection-pin accommodating area, formed in the matrix switch part in a substantially cross-shaped manner, accommodating the connection pins; wherein wiring patterns in the connection-pin accommodating area are electrically isolated from the wiring patterns in the matrix switch part.

According to the above matrix switch board, the substantially-cross-shaped connection-pin accommodating area is provided in the matrix switch part. Therefore, the through holes where the connection pin will be inserted or extracted becomes close to the connection-pin accommodating area, and, thus, an inserting-and-extracting operation of the connection pin may be efficiently carried out.

Other objects and further features of the present invention will be apparent from the following detailed description when read in conjunction with the accompanying drawings.

BRIEF DESCRIPTION OF THE DRAWINGS

FIG. 3A to FIG. 3C show configurations of a prior-art matrix switch board and connection pin used in the prior-art automatic MDF.

FIG. 3A shows the configuration of the prior-art matrix switch board,

FIG. 3B shows the configuration of the prior-art connection pin, and

FIG. 3C shows an illustration indicating a condition where the connection pin is inserted into the matrix switch board;

FIG. 9 shows a configuration of an embodiment of the matrix-switch-board unit according to the present invention;

FIG. 11 shows a detail configuration of the embodiment of the connection pin according to the present invention is in FIG. 6;

FIG. 13 shows an illustration for indicating a plurality of connection pins which are formed by drawing a pattern of metallic springs from a metallic plate;

FIG. 14 shows a cross-sectional view of another embodiment of the connection pin according to the present invention;

FIG. 15A to FIG. 15C show configurations of another matrix switch board according to the present invention.

FIG. 15A shows a top plan view of the matrix switch board,

FIG. 15B shows a cross-sectional view of the matrix switch board at a cutting line 71–71' shown in FIG. 15A, and FIG. 15C shows a cross-sectional view of the matrix switch board at a cutting line 73–73' shown in FIG. 15A;

FIG. 32A and FIG. 32B show another embodiment of the matrix switch board according to the present invention;

FIG. 33 shows another embodiment of the matrix switch board according to the present invention;

DETAILED DESCRIPTION OF THE PREFERRED EMBODIMENTS

Figure 1:
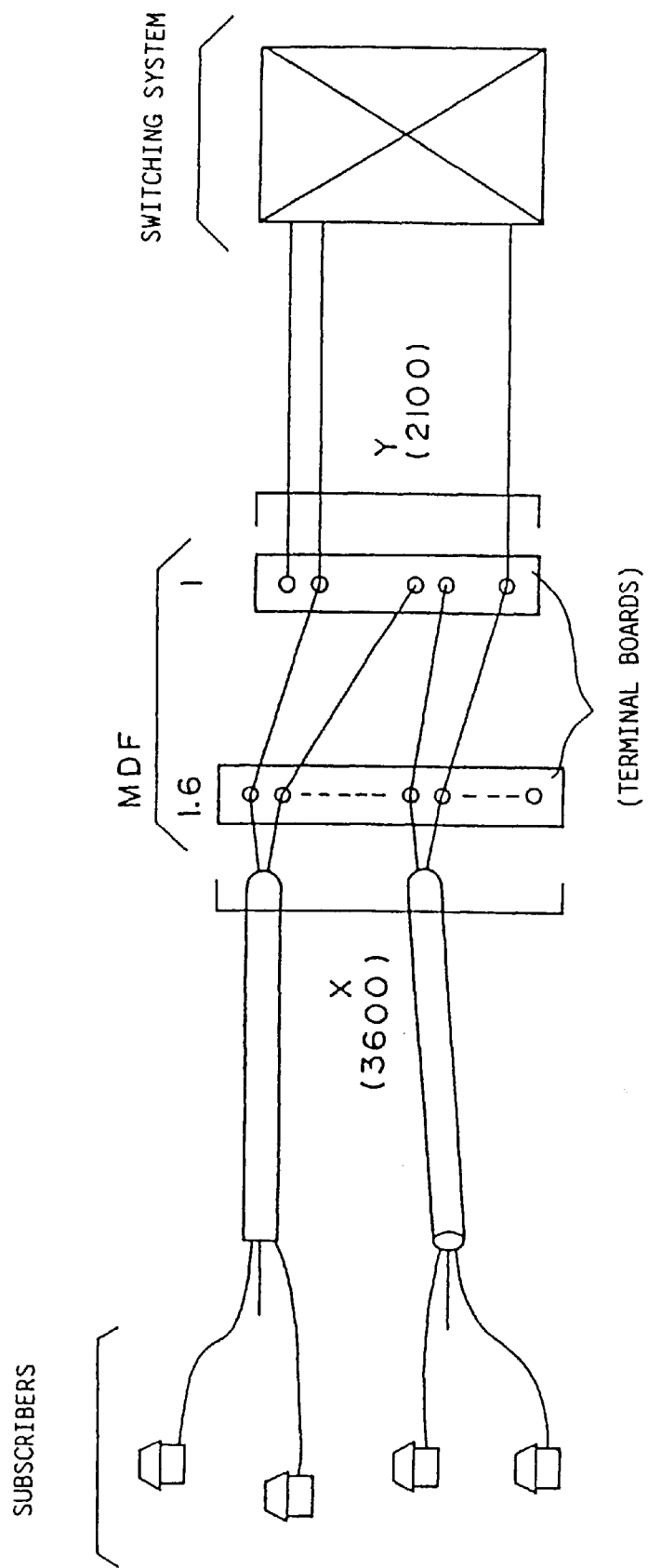
FIG. 1 is an illustration for explaining a typical function of a main distributing frame (MDF)
Figure 2:
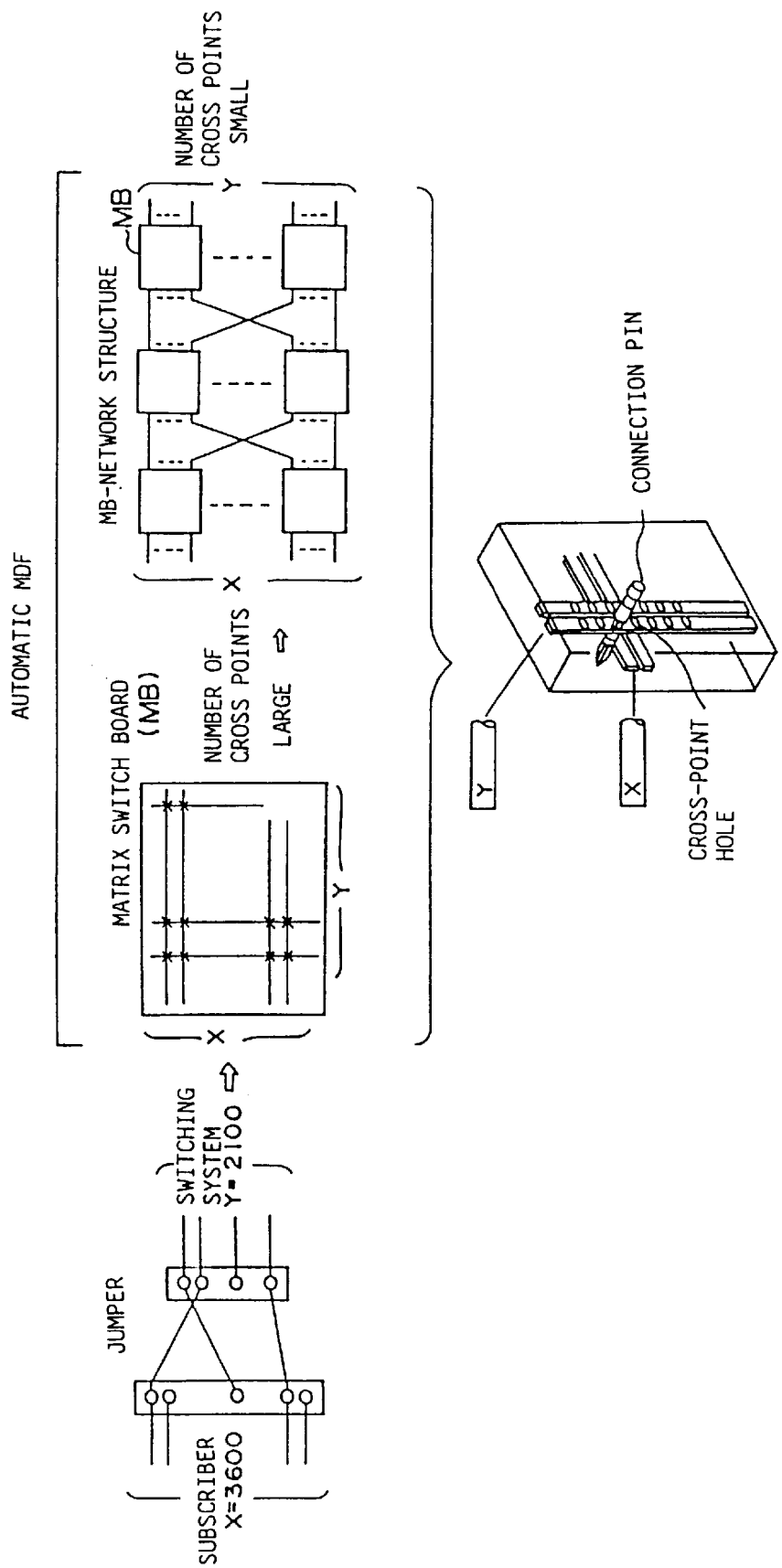
FIG. 2 shows a principle of a prior-art automatic MDF.
Figure 4:
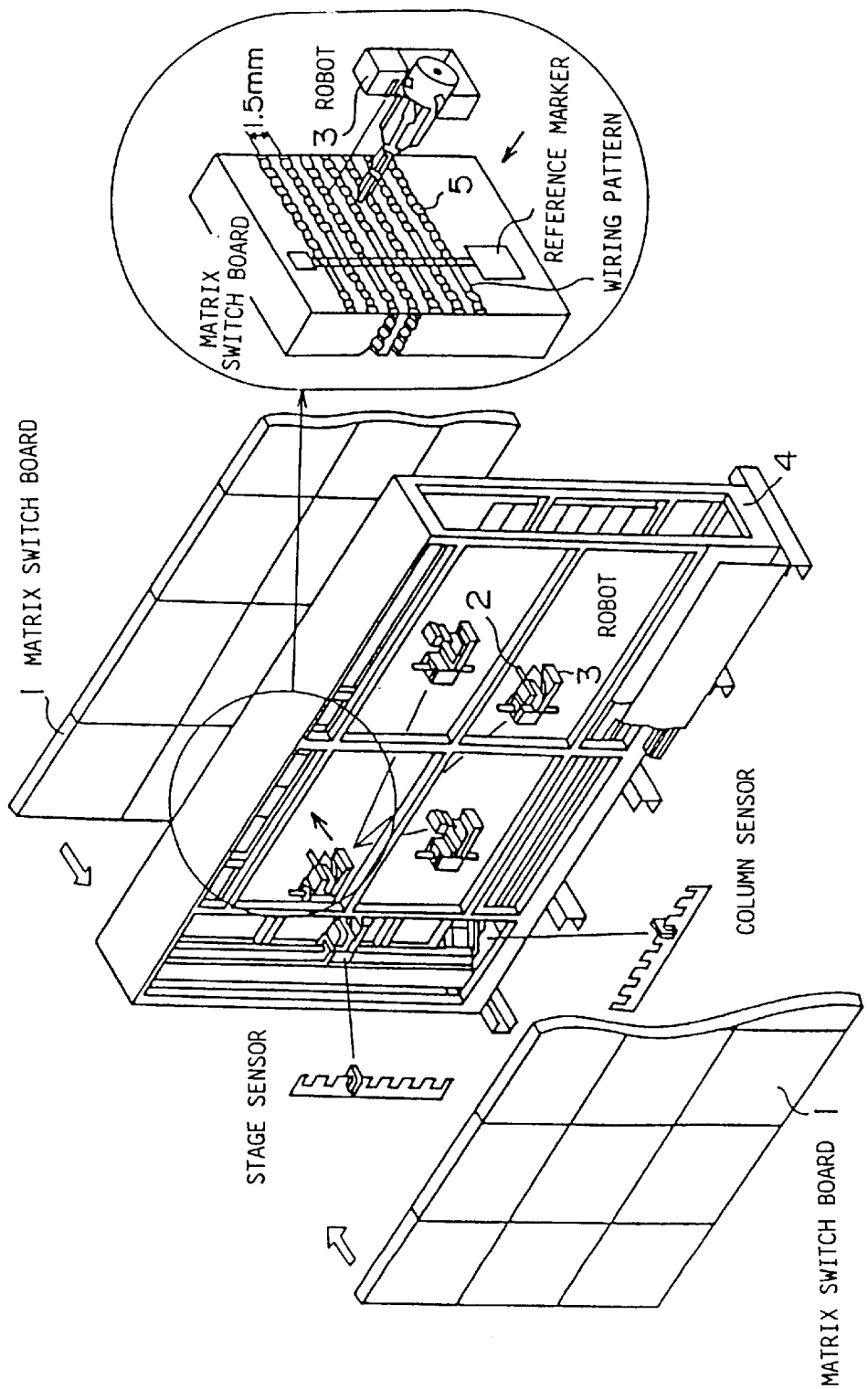
FIG. 4 shows a configuration of the prior-art automatic MDF.
Figure 5B:
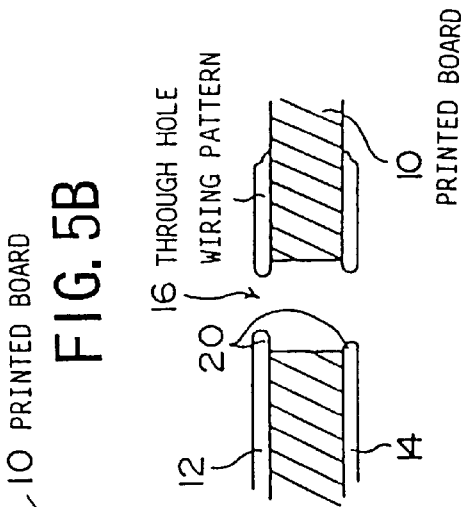
FIG. 5B shows a cross-sectional view of the embodiment of the matrix switch board.
Figure 5A:
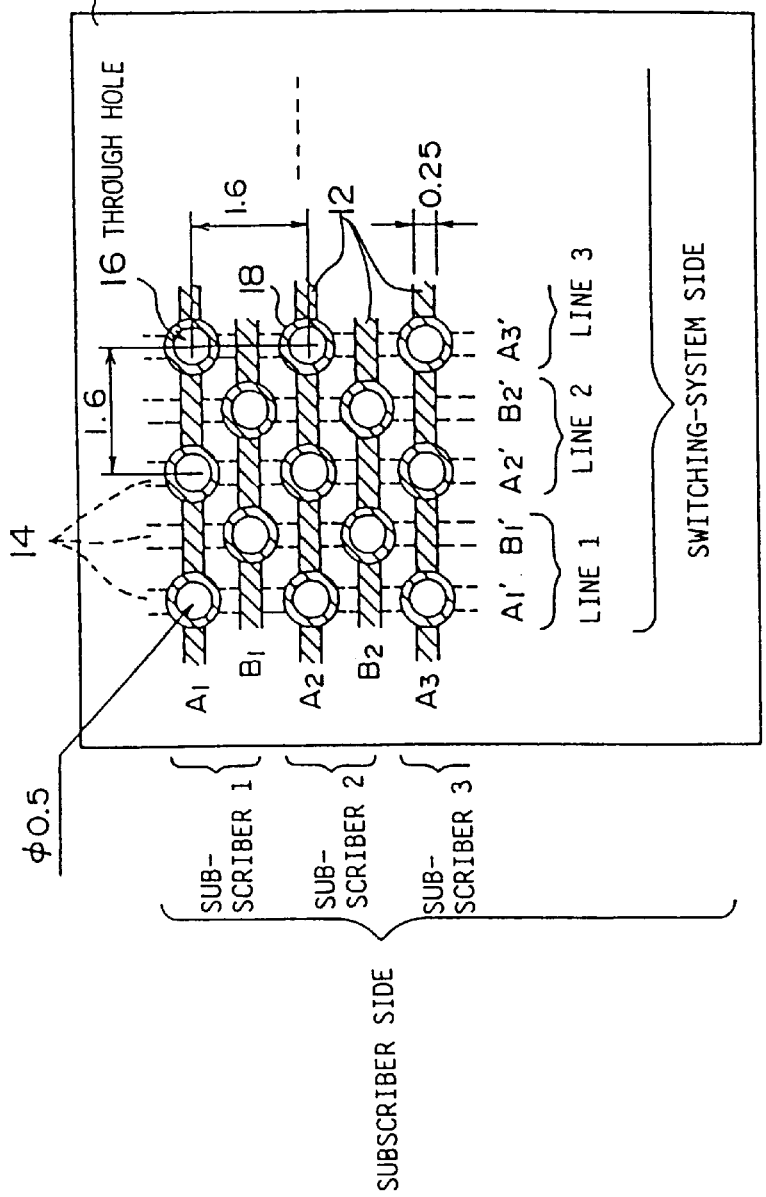
FIG. 5A shows a top plan view of an embodiment of a matrix switch board according to the present invention.
Figure 6:
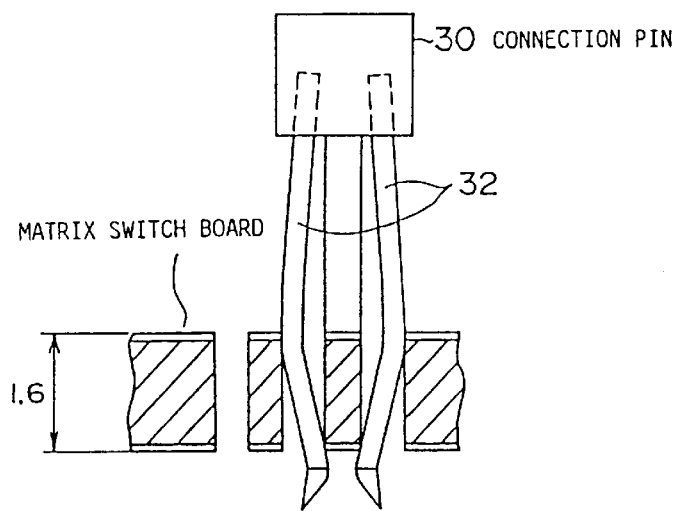
FIG. 6 shows a cross-sectional view of an embodiment of a connection pin according to the present invention.
Figure 7:
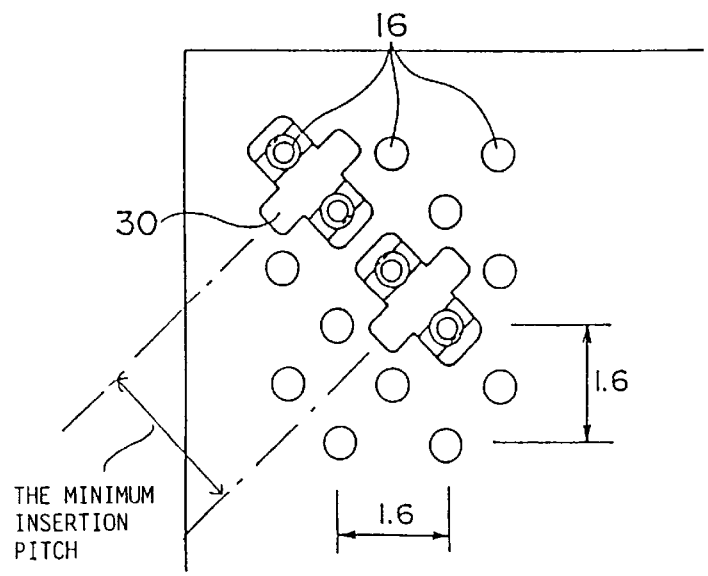
FIG. 7 shows a situation in which the connection pin according to the present invention is inserted into the matrix switch board according to the present invention.

First, a description will be given of an embodiment of a matrix switch board and a connection pin according to the present invention, by referring to FIG. 5A to FIG. 7. FIG. 5A shows a top plan view of the embodiment of the matrix switch board according to the present invention. FIG. 5B shows a cross-sectional view of the embodiment of the matrix switch board. FIG. 6 shows a cross-sectional view of the embodiment of the connection pin according to the present invention. FIG. 7 shows a situation in which the connection pin according to the present invention is inserted into the matrix switch board according to the present invention.

The matrix switch board shown in FIG. 5A is constructed with a two-layer-structure printed board 10, and on the front and back sides of the printed board 10, wiring patterns 12, 14 are arranged in a crossing direction at substantially a right angle. For example, the wiring pattern 12 on the front side may be used as a subscriber-side wire, and the wiring pattern 14 on the back side may be used as a switching-system-side wire. In this case, in the wiring pattern 12 formed on the front side, a pair of patterns positioned adjacent to each other forms two wires A and B for one subscriber line. Therefore, in the wiring pattern 12 on the front side, the wires A and B are alternatively arranged in parallel.

On the other hand, in the wiring pattern 14 formed on the back side, a pair of patterns positioned adjacent to each other forms two wires A' and B' for a switching system. Therefore, also in the wiring pattern 14 on the back side, the wires A' and B' are alternatively arranged in parallel.

In the above-discussed embodiment, so that the wires A on the front side and the wires A' on the back side are connected, a plurality of through holes 16 is formed at cross points of the wires A and A'. Further, so that the wires B on the front side and the wires B' on the back side are connected, a plurality of through holes 16 are formed at cross points of the wires B and B'. When the connection pin (not shown) is inserted into the through hole 16, the wire A on the front side and the wire A' on the back side may be connected to each other, and the wire B on the front side and the wire B' on the back side may be connected to each other.

Because the wires A and the wires B', and the wires B and the wires A' are not respectively connected, the through holes 16 are not provided at these cross points. Therefore, the through holes 16 may be provided at every other cross point in a direction of the wiring pattern 12 for the subscriber. Also, in a direction of the wiring pattern 14 for the switching system, the through holes 16 may be provided at every other cross point. In this way, through holes 16 are not consecutively provided at the adjacent cross points, and, thus, the through holes 16 may be provided with high density.

Also, in this wiring pattern structure, a sufficient interval of distance may be provided between the through hole and the adjacent wiring pattern, and between the adjacent wiring patterns. Therefore, these wiring patterns are prevented from unexpectedly be shorted, and, thus, a high reliability of insulation may be obtained.

In this embodiment, a pitch of the through hole arrangement for different subscribers is designed at approximately 1.6 mm. In the prior-art matrix switch board shown in FIG. 3A, an expensive 4-layer-structure printed board is used, and the pitch of the through hole arrangement for different subscribers is designed at approximately 1.5 mm. In this way, although the pitch of the through hole arrangement in the matrix switch board according to the present invention is substantially the same as that in the prior-art matrix switch board, the matrix switch board according to the present invention may be constructed with a cheaper two-layer-structure printed board, and, thus, a cost per one through hole may be reduced.

Further, as shown in FIG. 6, a connection pin 30 according to the present invention has two connection members 32 (metal springs) which are electrically isolated from each other. When the connection pin 30, as shown in FIG. 7, is inserted into two through holes 16 for the wires A and B of the above-discussed matrix switch board, two connections, those between the wire A on the front side and the wire A' on the back side and between the wire B on the front side and the wire B' on the back side, may simultaneously be carried out. The connection pins 30 are provided in a hound's tooth formation. Therefore, even if both wires A and B are formed on the same face of the printed board, the same connecting operability as that of the prior-art automatic MDF may be obtained.

Further, in the matrix switch board shown in FIG. 5A, around each through hole, a land 18 is provided. The land 18 is metallically plated, and a metallically plated part 20 is formed so as to overhang toward a center axis of the through hole. The overhung metallically plated part 20 may ensure an electrical connection between the connection pin and the wiring pattern.

Next, a description will be given of a method of manufacturing the matrix switch board shown in FIG. 5A, by referring to FIG. 8A to FIG. 8D. FIG. 8A to FIG. 8D show the method of manufacturing the matrix switch board according to the present invention shown in FIG. 5A.

Figure 8A:
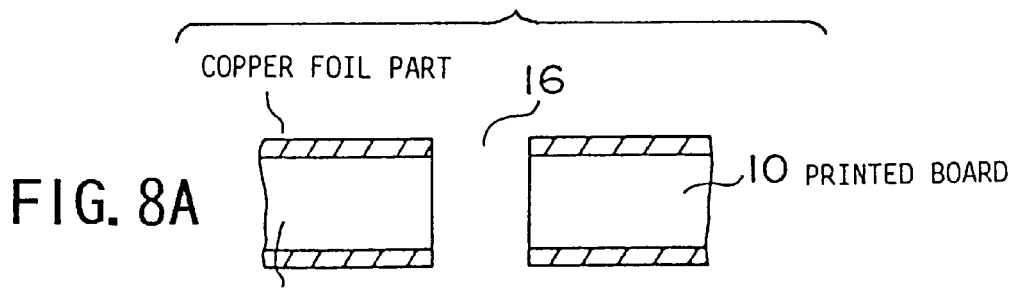
FIG. 8A to FIG. 8E show a method of manufacturing a matrix switch board according to the present invention shown in FIG. 5A.

In a manufacturing step shown in FIG. 8A, the printed board 10 is formed by covering the front and back sides of a resin such as a glass epoxy resin with copper foils (approximately 18-μm thickness), and the through hole 16 is formed in the printed board 10.

Figure 8B:
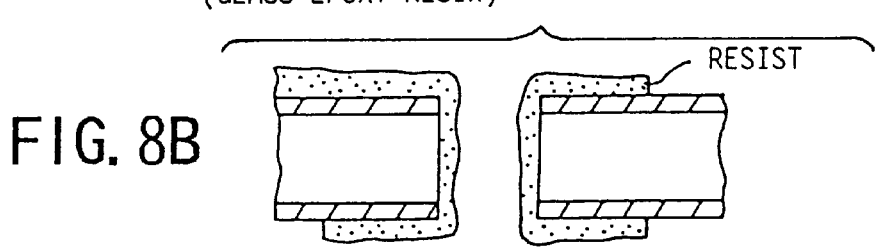

In a manufacturing step shown in FIG. 8B, a conductive layer is patterned by using a resist for the wiring-pattern parts of the copper foils of the front and back sides.

Figure 8C:
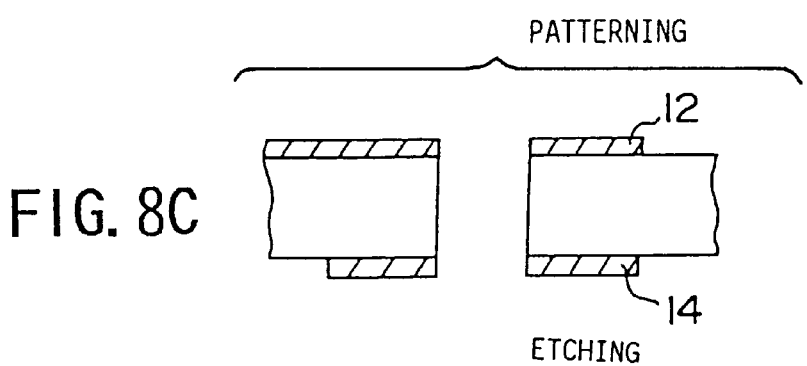

In a manufacturing step shown in FIG. 8C, the conductive layer is etched.

Figure 8D:
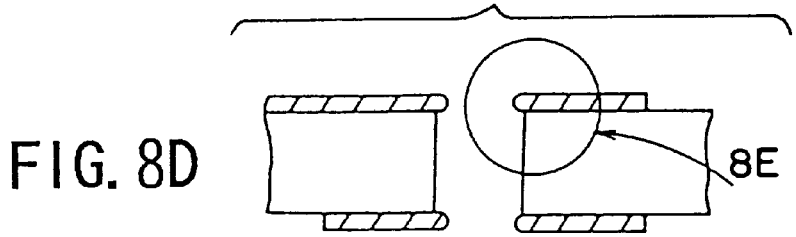
Figure 8E:
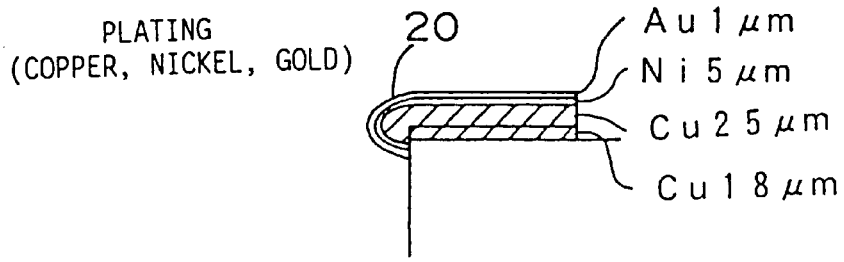

In a manufacturing step shown in FIG. 8D, a conductive pattern thus formed is used for a plating electrode, wherein electrolysis copper plating (approximately 25-μm thickness), nickel plating (approximately 5-μm thickness), and gold plating (approximately 1-μm thickness) are subsequently processed.

In this way, the plated part 20 is overhung toward the center axis of the through hole 16, and forms a contacting structure. Using such a simple method, the plated part 20 may easily be overhung, and, thus, an electrically positive contact between the connection pin and the wiring pattern may be realized.

Next, a description will be given of a configuration of an embodiment of a matrix-switch-board unit according to the present invention by referring to FIG. 9. FIG. 9 shows a configuration of the embodiment of the matrix-switch-board unit according to the present invention.

A matrix-switch-board unit 40 according to the present invention is constructed with one board, and the board is constructed with a plurality of matrix switch parts 42. Each matrix switch part 42 has the same configuration as that of the matrix switch board shown in FIG. 5A. However, the number of wiring patterns in the matrix switch part 42 is reduced as compared to the matrix switch board. The matrix-switch-board unit 40 shown in FIG. 9 is constructed with three 48×42 matrix switch parts, three 42×48 matrix switch parts, and twelve 50×52 matrix switch parts. When using the matrix-switch-board unit, the unit is commonly fixed to a frame such as a metal frame.

As discussed above, since the simple two-layer-structure printed board may be used for the matrix-switch-board unit, a large size matrix-switch-board unit including a plurality of matrix switch parts may easily be formed.

Figure 10:
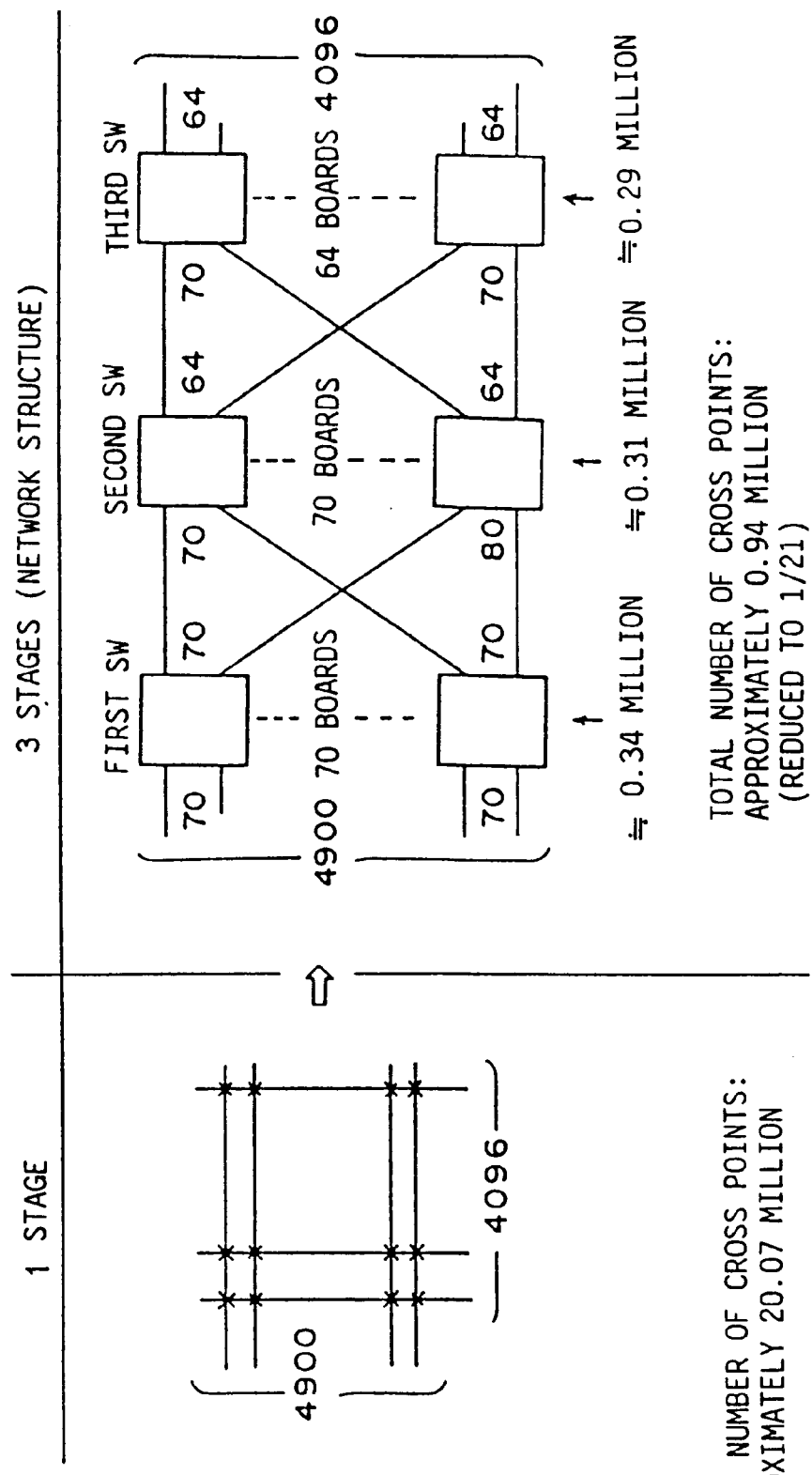
FIG. 10 shows an example of a network configuration of a matrix switch board in automatic distribution equipment.

FIG. 10 shows an example of a network configuration of a matrix switch board in automatic distribution equipment. For example, when connections between 4900 terminals on one side and 4096 terminals on another side are carried out using one matrix switch board, approximately 20.07-million cross-point holes are required. However, for example, when this connection network is constituted in three stages by using a plurality of different-sized matrix switch boards ((70×70) boards and (70×64) boards), the number of cross-point holes may be reduced to approximately 0.94 million.

The matrix-switch-board unit 40 shown in FIG. 9 may easily include such different-matrix-size matrix switch parts. Therefore, by using the matrix-switch-board unit according to the present invention, the network structure of the matrix switch board may easily be realized, and in that network structure, a large number of lines with high density may be constructed and the number of through holes may be reduced.

The matrix-switch-board unit 40 shown in FIG. 9 includes an input-and-output terminal 52 and a line terminal 54. The input-and-output terminal 52 and the line terminal 54 are respectively connected to input-and-output ports of the matrix switch parts through the wiring patterns. Therefore, the matrix switch parts may easily be connected to external lines through the input-and-output terminal 52, and easily be connected to another matrix-switch-board unit through the line terminal 54. In this way, by providing the input-and-output terminal 52 and the line terminal 54 to the matrix-switch-board unit, desired connection structure may be realized. Therefore, the above-discussed network structure of the matrix switch boards may easily be constructed.

The matrix-switch-board unit 40 shown in FIG. 9 is manufactured by the same method as the manufacturing processes shown in FIG. 8A to FIG. 8D. Namely, on one printed board, wiring patterns for a plurality of matrix switch parts 42 are formed, and the wiring patterns are simultaneously etched and plated. For simultaneously plating the wiring patterns of the plurality of matrix switch parts 42, these wiring patterns need to simultaneously be supplied with a voltage for plating. Therefore, as shown in FIG. 9, the wiring patterns of the plurality of matrix switch parts 42 is connected to each other through plate electrode lines 44. As a result, the plurality of matrix switch parts 42 may be supplied with power from one port.

After the plating process is finished, each plate electrode line 44 is cut by rooter processing 46 to separate the matrix switch parts 42 from each other. In this way, a plurality of matrix switch parts may be efficiently formed in one printed board.

In the matrix-switch-board unit 40 shown in FIG. 9, the plate electrode lines 44 are formed on the front and back sides so as to extend in a direction of the wiring patterns. By such a configuration of the plate electrode lines 44, the plating process and the cutting process of the plate electrode lines 44 may be efficiently carried out.

Further, in the matrix-switch-board unit 40 shown in FIG. 9, reference markers 48 are provided around each matrix switch part. The reference marker 48 may easily be formed by a hole. The reference markers 48 are used for a robot in automatic MDF searching for and detecting a designated through hole using a laser, etc.

The reference markers 48 are provided for each matrix switch part, and a positional relationship between the reference marker 48 and the through hole of the matrix switch part 42 can be precisely determined. Therefore, even if a positional relationship between the matrix switch parts 42 is dispersed, when the through hole is searched for based on the reference markers 48, the designated through hole may precisely be detected.

Furthermore, in the matrix-switch-board unit 40 shown in FIG. 9, a pin-supplying board 50 for accommodating the connection pins is provided. The pin-supplying board 50 has substantially the same configuration as that of the matrix switch board, and is removable. For example, when the automatic MDF is shipped, the connection pins are accommodated in the pin-supplying board 50. When, for example, the subscriber's address changes, and when it is ordered by an office to change the connection of the subscriber-side path, the robot extracts the connection pin from the pin-supplying board 50, and inserts the connection pin into the designated through hole in the matrix switch part 42. For example, in the pin-supplying board 50, approximately one thousand connection pins can be accommodated. In this way, by providing the pin-supplying board 50 for each matrix-switch-board unit, the robot does not need to go to other matrix-switch-board units for the connection pin. Therefore, the connection pin may efficiently be supplied to the robot, and, thus, an operation time of the robot may be reduced.

On the other hand, since the connection pin is supplied from the pin-supplying board 50 according to a request from the office side, some connection pins may not be used for a long period of time. In this case, such connection pins remain inserted into the pin-supplying board 50 for a long period of time. Because the connection pin has metal spring members, metal creeping of the spring members (degradation of elasticity of the spring) may occur due to a mechanical force exerted thereon. Therefore, in practical use, a diameter of the through hole of the pin-supplying board 50 is designed larger than a diameter of the through hole of the matrix switch part 42. In this configuration, the metal creeping of the spring members, which may occur before the connection pin will be used, may be reduced. Further, the diameter of the through hole in the pin-supplying board 50 can be larger, the through hole may be formed more easily, and, thus, a fabrication cost of the pin-supplying board 50 may be reduced.

As previously discussed above, the matrix-switch-board unit 40 shown in FIG. 9 is constructed with one printed board including a plurality of matrix switch parts 42. However, another matrix-switch-board unit may also be constructed with one printed board and a plurality of matrix switch boards thereon. In this matrix-switch-board unit, the plurality of matrix switch boards is respectively connected to the printed board through connectors. Namely, instead of each matrix switch part 42, the matrix switch board is used. Further, by providing an input-and-output terminal and internal wires connected thereto to the matrix-switch-board unit, the plurality of matrix switch boards may easily be connected to the input-and-output terminal through the internal wires.

Figure 12:
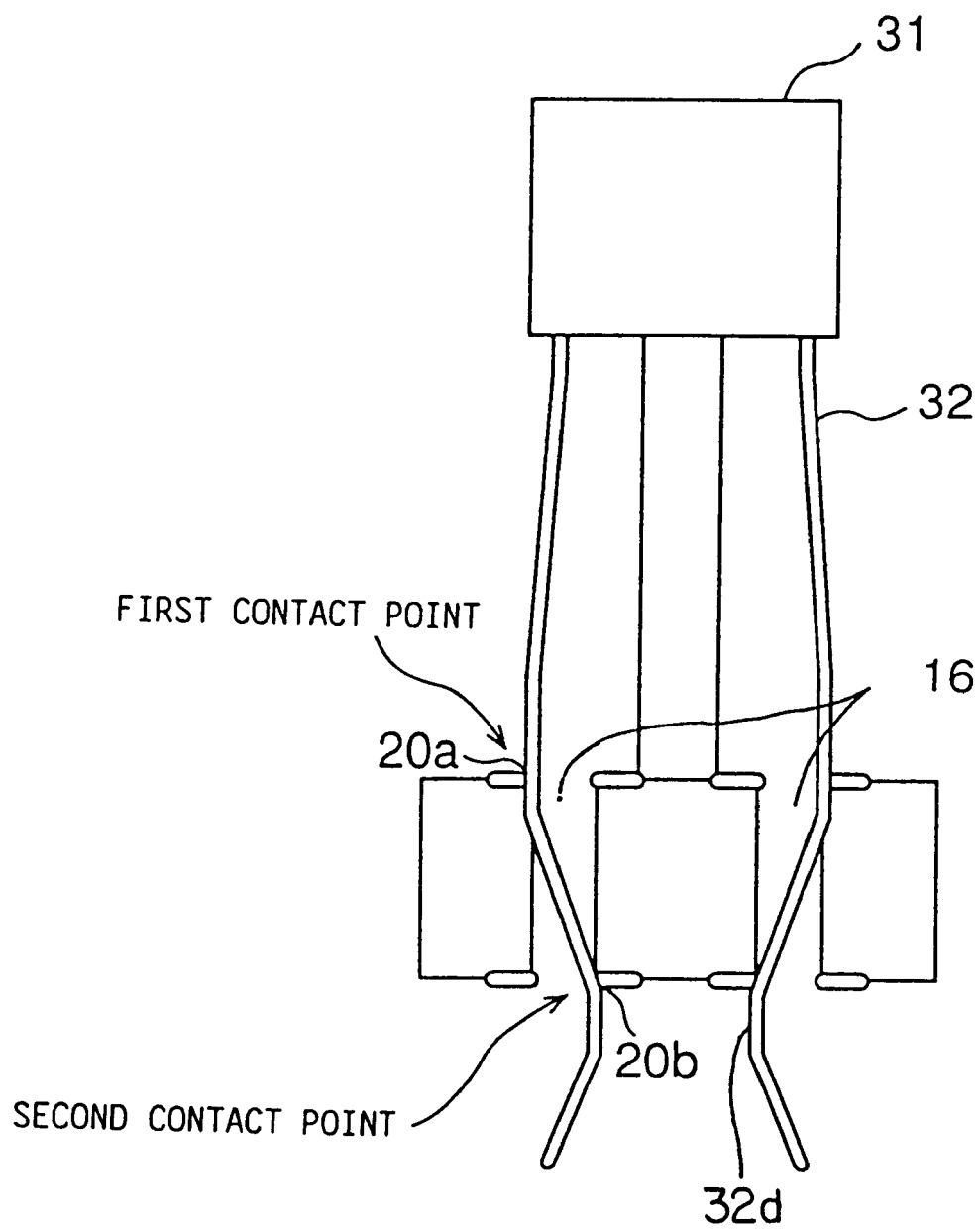
FIG. 12 shows an illustration for indicating a condition in which the connection pin shown in FIG. 11 is inserted into a through hole of the matrix switch board.

Next, a description will be given of an embodiment of the connection pin according to the present invention shown in FIG. 6, by referring to FIG. 11 and FIG. 12. FIG. 11 shows a detail configuration of the embodiment of the connection pin according to the present invention shown in FIG. 6. FIG. 12 is an illustration for indicating a condition in which the connection pin shown in FIG. 11 is inserted into the through hole of the matrix switch board.

The connection pin 30 shown in FIG. 11 is constructed with a cross-shaped base part 31 made of a resin and two metallic springs 32 fixed to the base part 31. In the base part 31, these two metallic springs 32 are electrically isolated from each other. Therefore, a material of the base part 31 is not limited to the resin, and another insulating material is usable for the base part 31.

These two metallic springs 32 are held so as to face each other. Each of the two metallic springs 32 is constructed with a first part 32a extending in parallel to the opposite one or extending so as to be separated from the opposite one, a second part 32b following the first part 32a and extending toward the opposite one, and a third part 32c (bottom end part) following the second part 32b and extending away from the opposite one. Further, the bottom end part 32c has, in a connection part with the second part 32b, a fourth part 32d in parallel to a central axis of the metallic springs 32 facing each other.

As shown in FIG. 12, when the connection pin 30 thus configured is inserted into the through holes, at a first contact point, an outside part of the first part 32a of the connection pin 30 contacts a plated part 20a overhanging inside the through hole 16, and at a second contact point, an inside part of the second part 32b contacts a plated part 20b overhanging inside the through hole 16. Particularly, at the second contact point, the second part 32b has a proper angle to contact an inside wall of the through hole 16. Therefore, a positive force is applied to the plated part 20b.

Further, in a part of the bottom end part 32c adjacent to the second part 32b, the fourth part 32d is provided in parallel to the inside wall of the through hole 16. Therefore, even when the connection pin 30 is extracted from the through holes 16 a short distance, the connection pin 30 is prevented from easily falling out of the through holes 16. Accordingly, by such a simple configuration having the two metallic springs, a positive connection may be maintained.

Each bottom end part 32c of the metallic spring 32 is processed in a taper shape, and the two bottom end parts 32c are designed so as to be arranged just above the two through holes 16 of the matrix switch board. Therefore, when the connection pin 30 is inserted into the small through holes 16 (0.5-mm diameter), the bottom end parts 32c which are respectively shaped in a taper form are operative as an inserting guide. This operation may reduce inserting mistakes.

In the connection pin shown in FIG. 11, each metallic spring 32 has a cross section of substantially a square shape, and a thickness of the first part 32a at the first contact point is designed to be larger. When the connection pin 30 is inserted into the through holes 16, at a contact face between the metallic spring 32 and the plated part 20 of the through hole 16, a force approximately 100-kg/mm$^2$ occurs. To absorb that strength by a limit strength of the metallic spring 32, the contacting part of the metallic spring 32 is designed so as to have a larger thickness.

However, it is not easy to manufacture such a metallic spring having a thinner part by a bending process. According to the present invention, such a metallic spring may easily be manufactured by drawing the pattern of the spring from a metal plate. Namely, in a front direction of the illustration of the metallic spring 32 shown in FIG. 11, the pattern of the spring is drawn. Therefore, for each part of the metallic spring, desired thickness and bending angle may flexibly be designed.

FIG. 13 illustrates a plurality of connection pins which are formed by drawing the pattern of the metallic springs from the metallic plate. In FIG. 13, a plurality of metallic springs 32 is successively formed by drawing the pattern of the springs from a reel-type metallic plate. After the plurality of metallic springs 32 is formed by the above-discussed pattern drawing, the base part 31 is molded for each metallic spring 32 to construct the connection pin. An arrangement pitch of the connection pins is set to integral multiples of the smallest insertion pitch shown in FIG. 7.

As shown in FIG. 13, since a plurality of connection pins can successively be constructed in a reel form, the plurality of connection pins may simultaneously be inserted into the pin-supplying board 50 shown in FIG. 9 or a pin-supplying area of the matrix switch board. Therefore, a large number of connection pins may be efficiently inserted into the pin-supplying area.

In the connection pin shown in FIG. 11, as previously discussed above, the metallic spring 32 substantially has the cross section of the square shape. Therefore, when the metallic spring 32 contacts the overhung plated part 20, a sufficient contact area may not be provided, and the plated part 20 may be damaged by an acute-angled corner of the metallic spring 32. As a result, high contacting reliability may not be expected.

Therefore, for high contacting reliability, as shown in the cross-sectional views of the second part 32b and the top part 32c of the metallic spring 32 in FIG. 11, a part of the metallic spring 32, which contacts the plated part 20 of the through hole 16, is chamfered (which is represented by a number "34", and a radius size for chamfering is 0.1 mm). In this configuration, a sufficient contact area may be obtained between the metallic spring 32 and the plated part 20 of the through hole 16. Therefore, the plated part 20 may not be damaged. As a result, high contacting reliability is expected. Also, when the robot inserts the connection pin 30 into the through hole 16, an inserting force of the robot may be reduced.

Further, in the connection pin 30 shown in FIG. 11, a pillar part 36, which extends from the base part 31 in a downward direction, is provided between the two metallic springs 32. The pillar part 36 physically restricts an insertion distance of the connection pin 30. In a practical operation, when the robot (not shown) inserts the connection pin 30 into the through holes 16, a bottom end part of the pillar part 36 contacts the surface of the matrix switch board. At this time, the robot detects a reaction force from the pillar part 36, and the robot stops inserting.

Therefore, by providing the pillar part 36 to the connection pin 30, a limit of the insertion distance of the connection pin 30 may easily be determined. Also, the pillar part 36 has a function of supporting the connection pin 30 to individually stand when the connection pin 30 is inserted into the through holes 16.

Further, in the connection pin 30 shown in FIG. 11, a part of the base part 31 has a taper structure 38. In the embodiment shown in FIG. 11, the taper angle is designed to be 34 degrees. When the robot extracts the inserted connection pin 30 from the through holes 16, the robot searches for and detects through holes adjacent to the through holes 16 where the designated connection pin 30 is inserted by using a laser, and calculates a position of the designated connection pin 30. In this case, when the robot searches the adjacent through holes by the laser, the laser beam may be interrupted by the base part 31 of the connection pin 30. Therefore, by providing the taper to the base part 31, the laser searching operation of the robot may be smoothly carried out.

Next, a description will be given of another embodiment of the connection pin according to the present invention, by referring to FIG. 14. FIG. 14 shows a cross-sectional view of another embodiment of the connection pin according to the present invention. A connection pin 60 is constructed with a base part 61 made of an insulating material and two metallic springs 62 fixed to the base part 61. The two metallic springs 62 are not electrically coupled to each other in the base part 61. Each metallic spring 62 is bent in a wavy shape, and has first, second and third bending parts 62a, 62b, 62c.

When the connection pin 60 is inserted into the through holes 16 of the matrix switch board, the first bending part 62a and the third bending part 62c contact the plated part 20 of the through hole 16, and the second bending part 62b contacts the inside wall part 22 of the through hole 16. Therefore, the connection pin 60 is supported at three points of the through hole 16, and, thus, the metallic spring 62 does not apply a force to the base part 61. As a result, the base part 61 is prevented from being damaged by a force from the metallic spring 62.

The connection pin 60 according to the present invention also has substantially the same features as those of the connection pin 30 shown in FIG. 11, for example, the chamfering of the metallic spring, the bottom-end-part processing having the taper structure of the metallic spring, and the taper structure of the base part.

Next, a description will be given of another matrix switch board according to the present invention, by referring to FIG. 15A to FIG. 15C. FIG. 15A to FIG. 15C show configurations of another matrix switch board according to the present invention. FIG. 15A shows a top plan view of the matrix switch board, FIG. 15B shows a cross-sectional view of the matrix switch board at a cutting line 71–71' shown in FIG. 15A, and FIG. 15C shows a cross-sectional view of the matrix switch board at a cutting line 73–73' shown in FIG. 15A.

A matrix switch board 70 shown in FIG. 15A uses a four-layer-structure printed board 72. The matrix switch board 70 has two matrix switch parts 74-1, 74-2, an input-and-output connector 76, and wiring parts 78 connecting them.

For each matrix switch part 74-1, 74-2, on the front and back sides (first and fourth wiring layers L1, L4) of the printed board 72, wiring patterns 82, 84 are arranged so as to cross each other at a right angle, in the same way as the matrix switch board shown in FIG. 5A. For example, the wiring pattern 82 on the front side may be used as the subscriber-side wire, and the wiring pattern 84 on the back side may be used as the switching-system-side wire. In this case, in the wiring pattern 82 formed on the front side, a pair of wiring patterns positioned adjacent to each other forms the two wires A and B for one subscriber line. Therefore, in the wiring pattern 82 on the front side, the wires A and B are alternatively arranged in parallel.

On the other hand, in the wiring pattern 84 formed on the back side, a pair of wiring patterns positioned adjacent to each other forms the two wires A' and B' for the switching system. Therefore, also in the wiring pattern 84 on the back side, the wires A' and B' are alternatively arranged in parallel.

In the above-discussed embodiment, so that the wires A on the front side and the wires A' on the back side are connected, a plurality of through holes 90 is formed at the cross points of the wires A and A'. Further, so that wires B on the front side and the wires B' on the back side are connected, a plurality of through holes 90 are formed at the cross points of the wires B and B'. When the connection pin is inserted into the through hole 90, the wire A on the front side and the wire A' on the back side may be connected to each other, and the wire B on the front side and the wire B' on the back side may be connected to each other.

Therefore, the through holes 90 may be provided at every other cross point in a direction of the wiring pattern 82 for the subscriber. Also, in a direction of the wiring pattern 84 for the switching system, the through holes 90 may be provided at every other cross point. The above-discussed configuration of the matrix switch board 70 is the same as that of the matrix switch board shown in FIG. 5A. Accordingly, the matrix switch board 70 has substantially the same features as those of the matrix switch board shown in FIG. 5A.

However, as shown in FIG. 15B, the matrix switch part 74-1 is different from the matrix switch board shown in FIG. 5A. Namely, in second and third wiring layers L2, L3 of the printed board 72, wiring patterns 86, 88 are arranged in parallel in a vertical direction. In this embodiment, as shown in FIG. 15A, the wiring patterns 86, 88 are arranged so as to twist between the through holes 90 along the wiring pattern 82. In this case, a pair of the upper-side wiring pattern 86 and the lower-side wiring pattern 88 may be used for a pair of lines (A wire and B wire) for one subscriber or a pair of lines (A' wire and B' wire) for the switching system.

Further, the matrix switch parts 74-1, 74-2 are connected with the input-and-output connector 76 through the wiring parts 78. Also, a part of the matrix switch part 74-2 is connected to the input-and-output connector 76 through the wiring patterns 86, 88 in the matrix switch part 74-1.

As shown in FIG. 15C, in the wiring parts 78, wiring patterns 92, 94, 96, 98 are arranged with high density, and are used for a large number of lines transmitting input and output signals. Therefore, a cross talk, where a transmission signal in one line leaks to another line, may occur. In the matrix switch part 70 according to the present invention, the wiring-pattern configuration is designed so as to reduce the cross talk.

Figure 16:
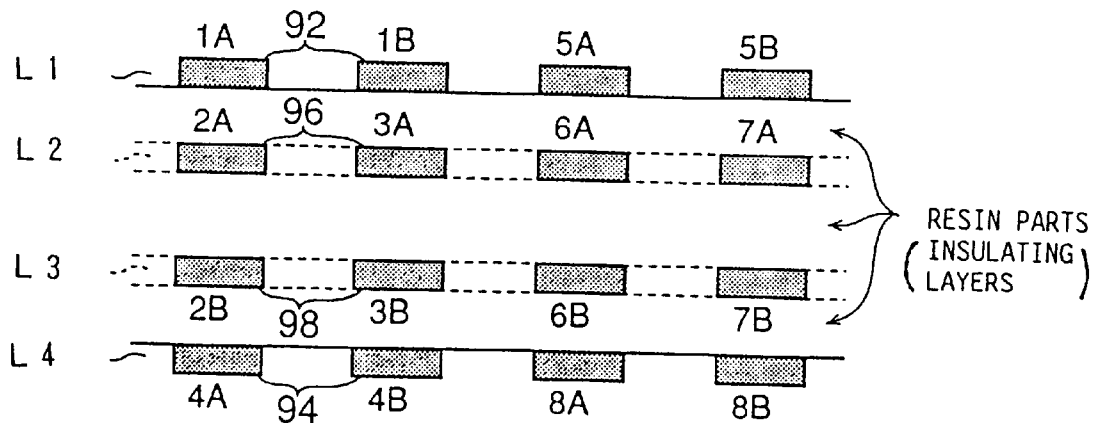
FIG. 16 to FIG. 18 show configuration examples of wiring patterns in wiring parts shown in FIG. 15A.
Figure 17:
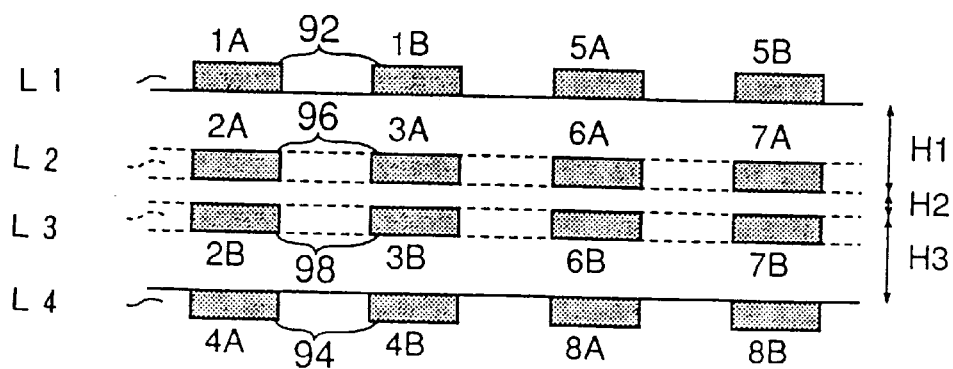
Figure 18:
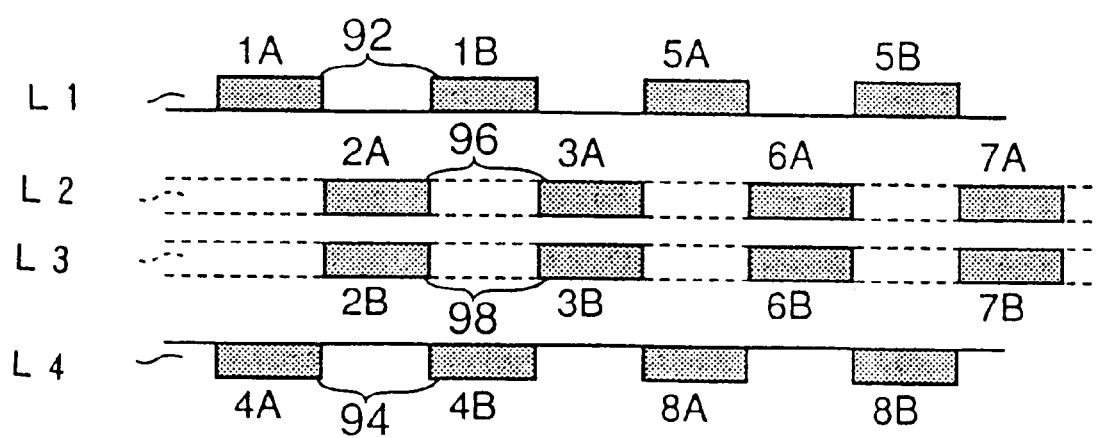

In the following, a detailed description will be given of the wiring-pattern configuration to reduce the cross talk. FIG. 16 to FIG. 18 show configuration examples of the wiring patterns in the wiring parts 78 shown in FIG. 15A. In the wiring parts 78, since there is no through hole 90, the four wiring patterns 92, 96, 98, 94 are respectively formed in first to fourth wiring layers in parallel to each other.

In these configuration examples, for each wiring pattern 92, 94 in the first or fourth wiring layer (on the front and back sides of the printed board 72), a pair of adjoining wiring patterns constructs one line for one subscriber constructed with the A wire and B wire (represented by, for example, 1A and 1B). This one pair of adjoining wiring patterns is referred to as "a first group of wiring patterns", hereinafter. Therefore, in each of the wiring patterns 92, 94, the wires A (or A') and B (or B') are alternatively arranged in parallel.

On the other hand, for wiring patterns 96, 98 in the second and third wiring layers, a pair of upper-and-lower-side wiring patterns 96, 98 constructs the one line for one subscriber constructed with the A wire and B wire (represented by, for example, 2A and 2B). This one pair of upper-and-lower-side wiring patterns is referred to as "a second group of wiring patterns", hereinafter.

As discussed above, the wiring-pattern configuration of the matrix switch board 70 having the first group of wiring patterns and the second group of wiring patterns is different from that of the matrix switch board shown in FIG. 5A, where a plurality of pairs of A wire and B wire are repeatedly arranged only in a horizontal direction. Such a wiring-pattern configuration of the matrix switch board 70 has a feature to reduce the cross talk between the lines as compared to the matrix switch board shown in FIG. 5A.

In the configuration example of the wiring patterns shown in FIG. 16, the wiring patterns 92, 96, 98, 94 are successively formed in a vertical direction. In the configuration example of the wiring patterns shown in FIG. 17, a gap distance H2 between the wiring pattern 96 and the wiring pattern 98 is less than a gap distance H2 between the wiring pattern 92 and the wiring pattern 96, and a gap distance H3 between the wiring pattern 98 and the wiring pattern 94. As discussed above, because the gap distance H1 between the wiring pattern 96 and the wiring pattern 98 is relatively narrower, the second group of wiring patterns constructed with the wiring pattern 96 and the wiring pattern 98 is hardly influenced by outside noise.

In the configuration example of the wiring patterns shown in FIG. 18, the second group of wiring patterns (wiring patterns 96, 98) are formed between the first group of wiring patterns (between the wiring patterns 92, and between the wiring patterns 94). Such wiring-pattern configuration may further reduce the cross talk. The cross-talk reduction property of such wiring-pattern configuration is experimentally analyzed as shown in the following description.

Figure 19:
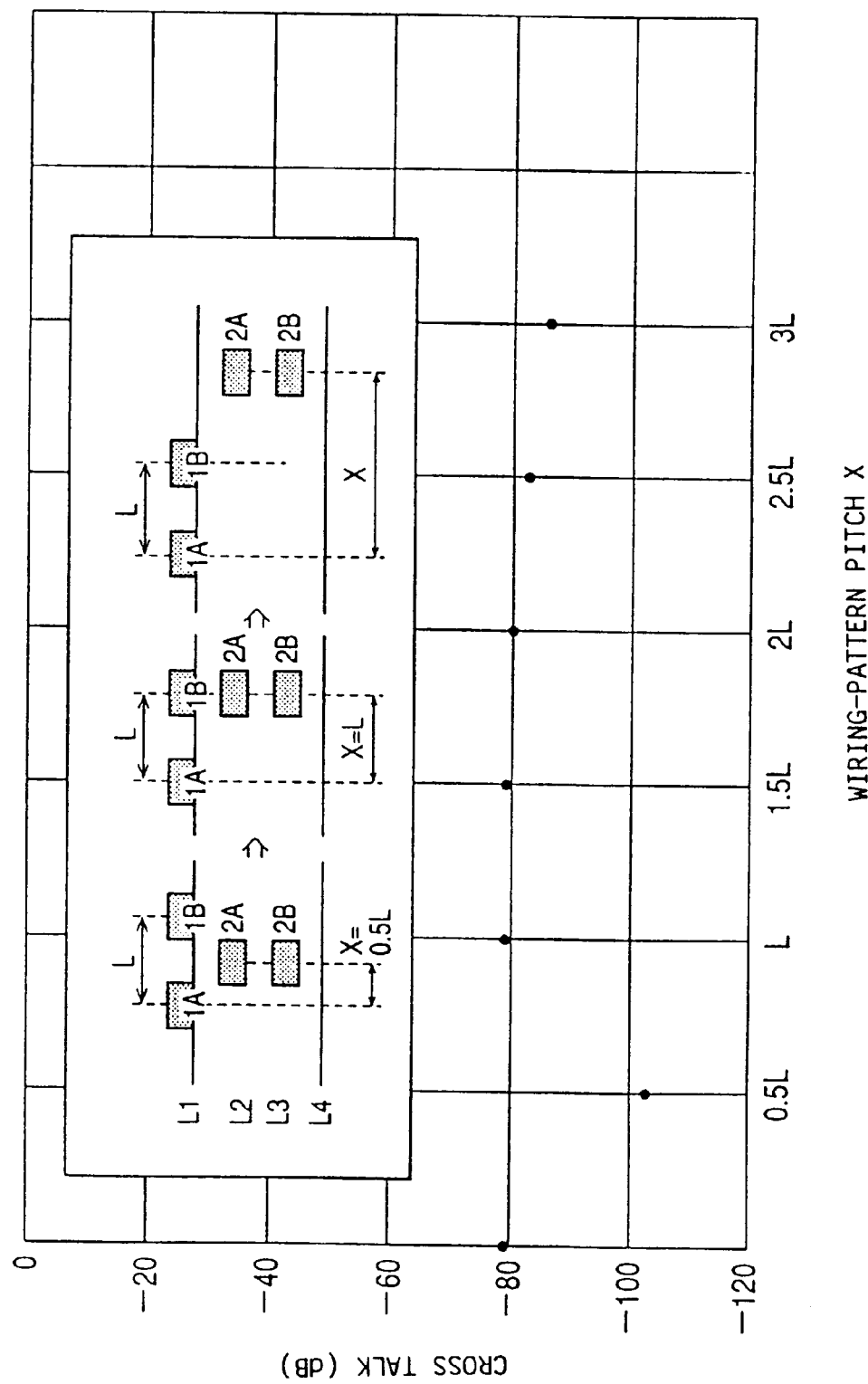
FIG. 19 shows a dependence of cross talk on a positional relationship between a first group of wiring patterns in a first wiring layer and a second group of wiring patterns in second and third wiring layers in the configuration example of the wiring patterns shown in FIG. 18.

FIG. 19 shows the cross talk as a function of a positional relationship between the first group of wiring patterns in the first wiring layer and the second group of wiring patterns in the second and third wiring layers in the configuration example of the wiring patterns shown in FIG. 18. An interval of distance between the wiring patterns 92 in the first wiring layer is represented by a symbol "L". In FIG. 19, the cross talk from the first group of wiring patterns to the second group of wiring patterns is shown according to a distance X in a horizontal direction from the wiring pattern 1A of the first group of wiring patterns to the wiring pattern 2A (or 2B) of the second group of wiring patterns. From this drawing, it is found that when the second group of wiring patterns are positioned between the first group of wiring patterns as shown in FIG. 18, the cross talk is minimized.

Figure 20:
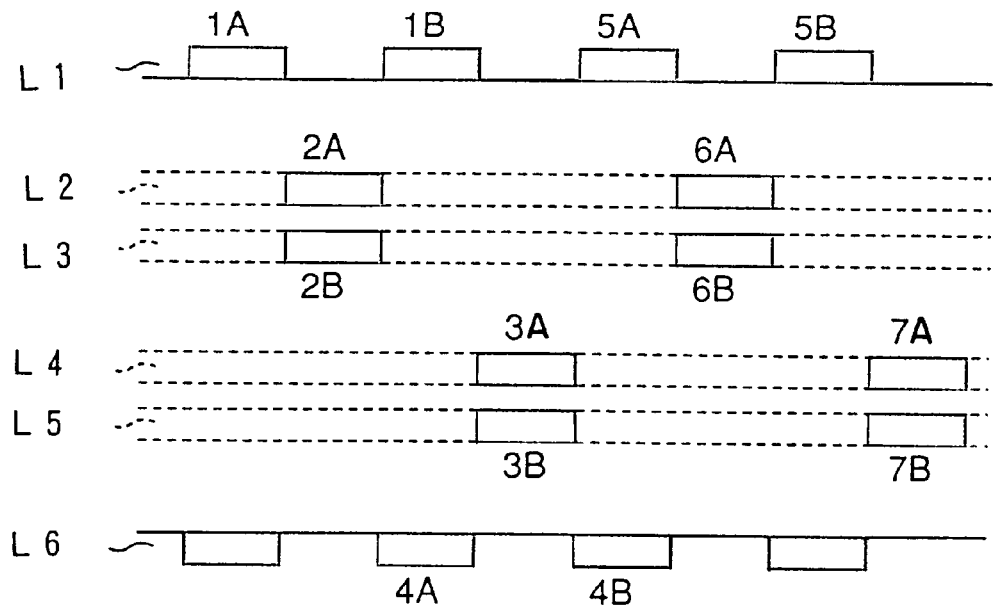
FIG. 20 shows a configuration example of wiring patterns of the wiring parts when a six-layer-structure is used for the matrix switch board.

FIG. 20 shows a configuration example of wiring patterns of the wiring parts when a six-layer-structure is used for the matrix switch board. In the configuration example of FIG. 20, in the same way as that shown in FIG. 18, the wiring patterns 2A, 2B of the second and third wiring layers are formed between the wiring pattern 1A and the wiring pattern 1B of the first wiring layer. Therefore, cross talk between the line constructed with a pair of wiring patterns 1A and 1B and the line constructed with a pair of wiring patterns 2A and 2B may be reduced.

Further, in the configuration example of FIG. 20, wiring patterns 3A, 3B of fourth and fifth wiring layers are formed between the wiring pattern 4A and the wiring pattern 4B of the sixth wiring layer. Therefore, cross talk between a line constructed with a pair of wiring patterns 4A and 4B and a line constructed with a pair of wiring patterns 3A and 3B may be reduced.

Furthermore, in the following, other configuration examples of the wiring patterns to reduce the cross talk will be discussed. FIG. 21 to FIG. 25 show the configuration examples of the wiring patterns in the wiring parts shown in FIG. 15A.

Figure 21:
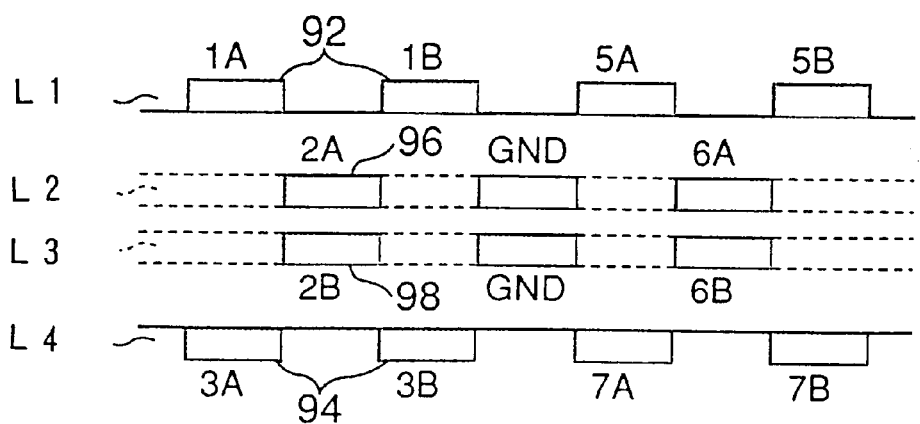
FIG. 21 to FIG. 25 show configuration examples of the wiring patterns in the wiring parts shown in FIG. 15A.

In the configuration example of wiring patterns shown in FIG. 21, ground patterns are formed adjacent to the second group of wiring patterns of the wiring patterns 96, 98. By providing the ground patterns, noise may be bypassed through the ground patterns, and, thus, the cross talk between the lines may be reduced.

Figure 22:
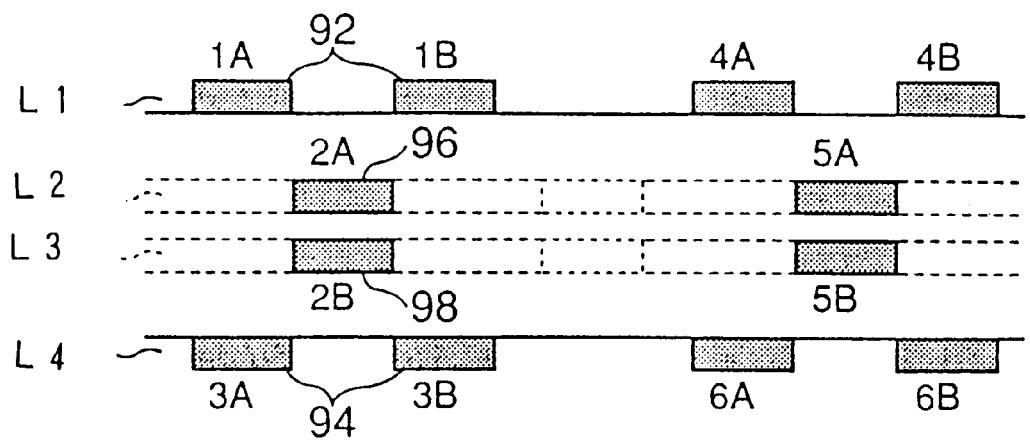

In the configuration example of wiring patterns shown in FIG. 22, the ground patterns in the wiring patterns of FIG. 21 are eliminated. Namely, the second group of wiring patterns constructed with the wiring patterns 96 and 98 are arranged in an arranging pitch of the first group of wiring patterns constructed with the wiring patterns 92 or the wiring patterns 94. In this case, an interval of distance between the adjoining second groups of the wiring patterns are relatively separated from each other, and, thus, the cross talk between the lines may be reduced.

Figure 23:
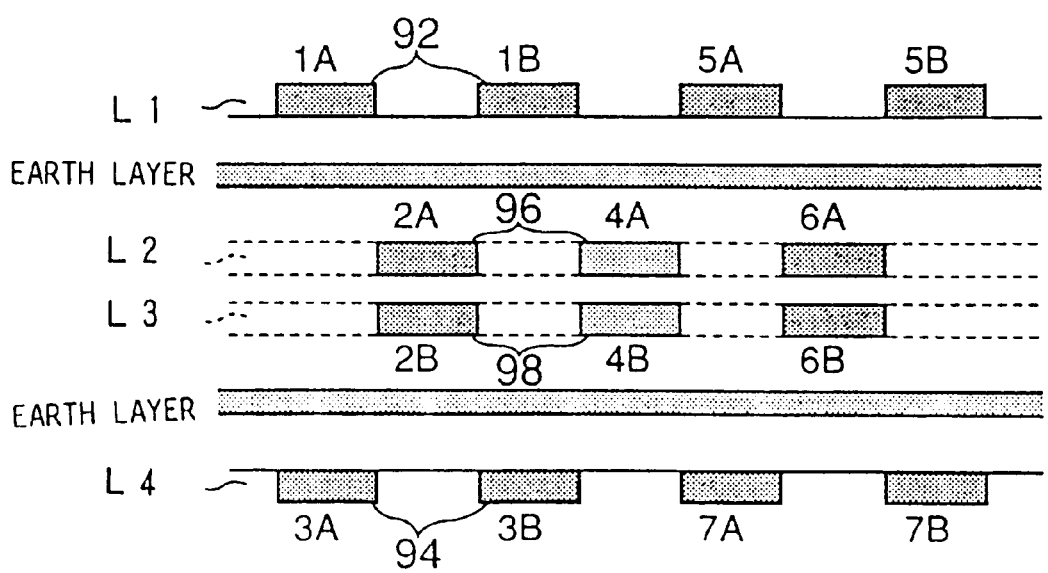

In the configuration example of wiring patterns shown in FIG. 23, earth ground layers are respectively provided between the first wiring layer and the second wiring layer, and between the third wiring layer and the fourth wiring layer. The earth ground layers may reduce cross talk between a line using the second group of wiring patterns constructed with the wiring patterns 96 and 98 and a line using the first group of wiring patterns constructed with the wiring patterns 92 or the wiring patterns 94.

Figure 24:
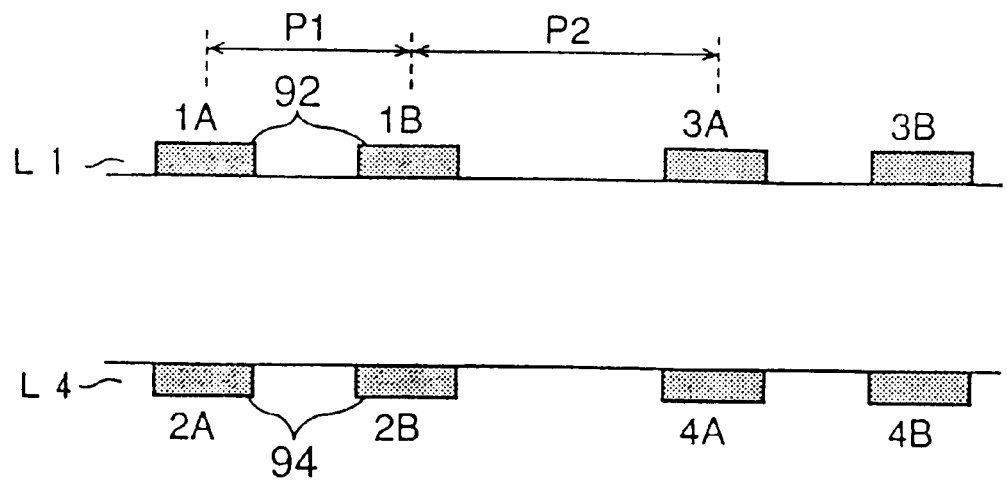

In the configuration example of wiring patterns shown in FIG. 24, an interval of distance P2 between the adjoining first groups of wiring patterns is larger than an interval of distance P1 between the first group of wiring patterns. Further, in the configuration example of wiring patterns shown in FIG. 25, a ground pattern is provided between the adjoining first groups of wiring patterns. These wiring-pattern configurations may reduce cross talk between the lines using the adjoining first groups of wiring patterns. Further, in the configuration of FIG. 25, when a high-speed signal transmits through the lines, the cross talk between the lines may further be reduced.

The above-discussed configuration examples of the wiring patterns shown in FIG. 16 to FIG. 25 are not limited to the matrix switch board 70 shown in FIG. 15A, but, also, are applicable to back boards of the automatic distribution equipment to which the matrix switch board 70 is mounted.

Figure 25:
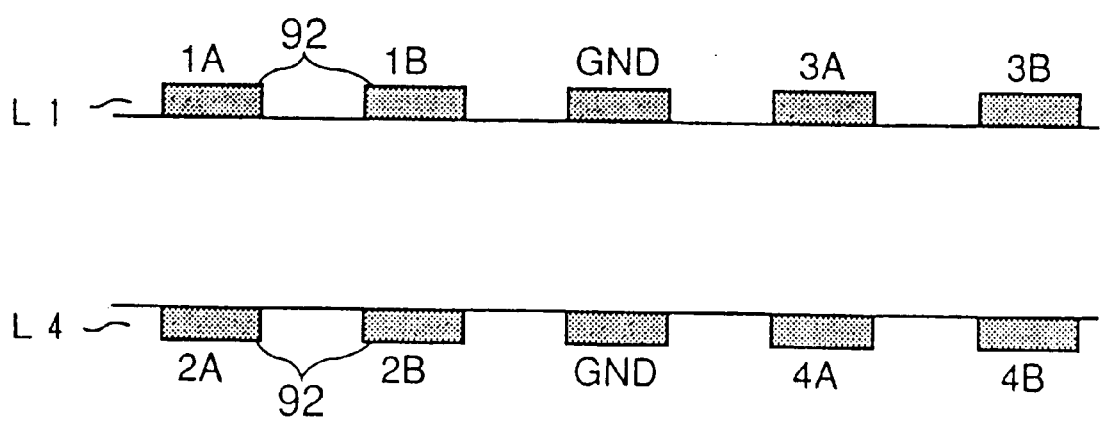

Further, the above-discussed configuration examples of the wiring patterns shown in FIG. 24 and FIG. 25 are not limited to the configuration of the wiring parts 78, but, also, are applicable to the matrix switch parts 74-1, 74-2 shown in FIG. 15A and the matrix switch board shown in FIG. 5A.

Next, a detailed description will be given of the wiring patterns of the matrix switch parts 74-1, 74-2. As discussed above, in the configuration example shown in FIG. 15A, the wiring patterns 86, 88 of the second and third wiring layers are formed so as to twist between the through holes 90 along the wiring pattern 82. Also, the above-mentioned part of the matrix switch part 74-2 is connected to the input-and-output connector 76 through the wiring patterns 86, 88 formed within the matrix switch part 74-1. Therefore, in the matrix switch board 70, there is no need for preparing wide-area wiring parts 78 for connecting between the matrix switch part 74-2 and the input-and-output connector 76. Accordingly, the matrix switch board 70 may be miniaturized.

Figure 26:
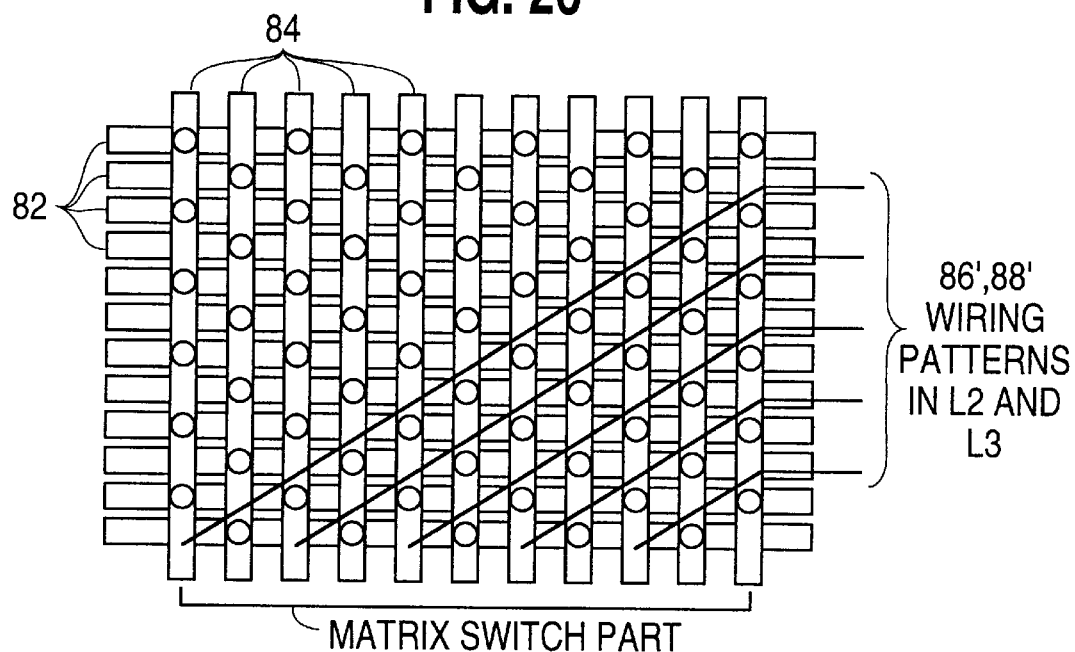
FIG. 26 shows another configuration example of the wiring patterns of the second and third wiring layers in the matrix switch part shown in FIG. 15A.

FIG. 26 shows another configuration example of the wiring patterns of the second and third wiring layers in the matrix switch part shown in FIG. 15A. In the configuration example, wiring patterns 86', 88' of the second and third wiring layers are arranged diagonally to a direction of the wiring pattern 82 between the through holes 90. In this case, the wiring patterns 86', 88' are not formed along the wiring pattern 82. Therefore, this configuration may further reduce cross talk between a line using the two wiring patterns 82 and a line using the two wiring patterns 86' and 88' as compared to the configuration example shown in FIG. 15A.

Figure 27A:
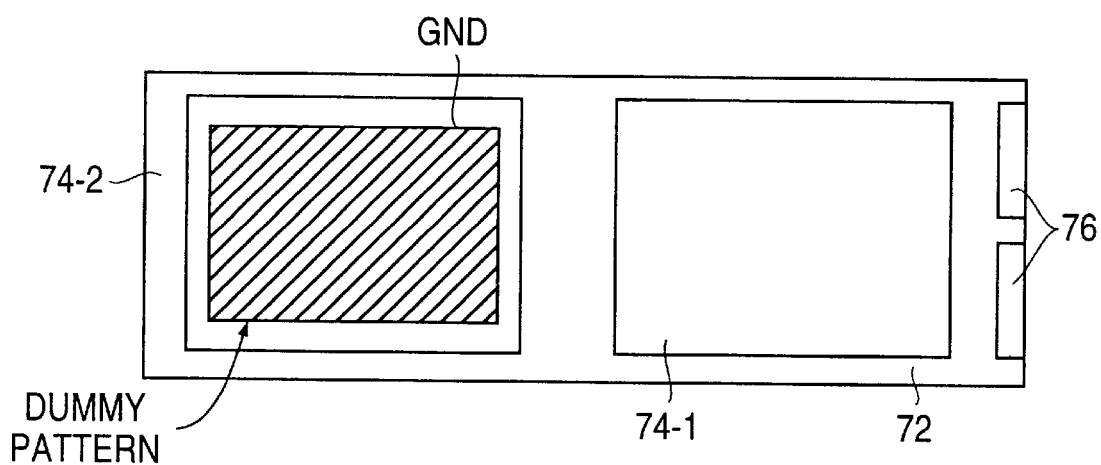
FIG. 27 shows a configuration example of the wiring patterns of the two matrix switch parts shown in FIG. 15A.
Figure 27B:
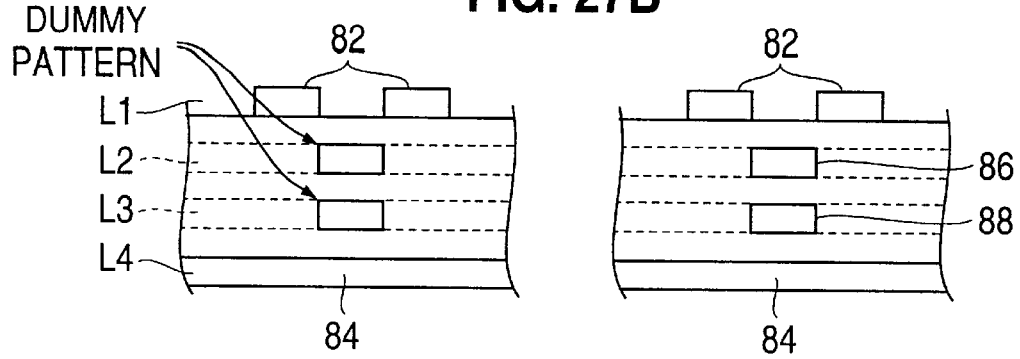

FIG. 27 shows a configuration example of the wiring patterns of the two matrix switch parts shown in FIG. 15A. As discussed above, in the matrix switch part 74-1, the wiring patterns 86, 88 are formed in the second and third wiring layers, respectively. Since the matrix switch part 74-2 does not have a third matrix switch part in the adjacent area, there is no need for providing wiring patterns in the second and third wiring layers in the matrix switch part 74-2. However, when the second and third wiring layers are not formed in the matrix switch part 74-2, the matrix switch part 74-1 and the matrix switch part 74-2 have a different thickness. As a result, the matrix switch board 70 may bend. Therefore, in this configuration example, in the matrix switch part 74-2, instead of the wiring patterns 86, 88, dummy patterns 100, 102 are provided. Further, to prevent electric charge from being charged to the dummy patterns 100, 102, the dummy patterns 100, 102 are connected to an earth ground.

Figure 28:
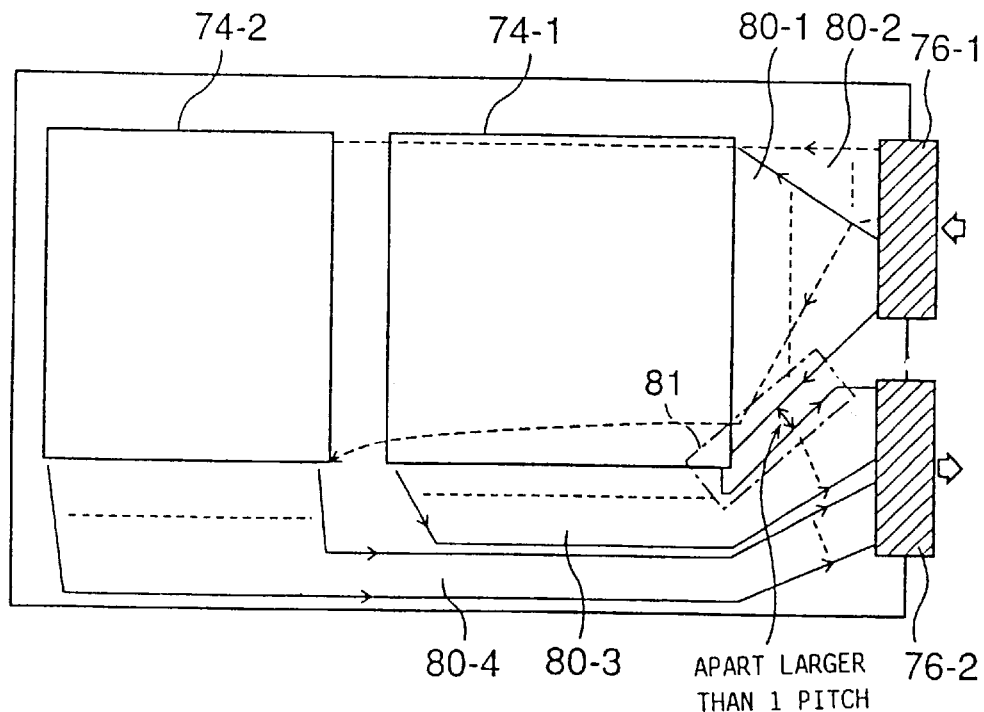
FIG. 28 shows a connection relationship between the matrix switch part and an input-and-output connector shown in FIG. 15A.

Next, a description will be given of a connection relationship between the matrix switch part and the input-and-output connector. FIG. 28 shows the connection relationship between the matrix switch part and the input-and-output connector. In FIG. 28, the input-and-output connector 76 is constructed with an input connector 76-1 and an output connector 76-2.

In the connection relationship shown in FIG. 28, the matrix switch part 74-1 is connected with the input connector 76-1 through wiring patterns 80-1, and is connected with the output connector 76-2 through wiring patterns 80-3. The matrix switch part 74-2 is connected with the input connector 76-1 through wiring patterns 80-2, and is connected with the output connector 76-2 through wiring patterns 80-4.

In this case, in an area 81 shown in FIG. 28, the wiring patterns 80-1 for input signals and the wiring patterns 80-3 for output signals are close to each other, and, thus, cross talk may occur between the wiring patterns 80-1 and the wiring patterns 80-3, as compared to a case where the same direction signals are transmitted in the wiring patterns 80-1 and 80-3. Therefore, in this embodiment, an interval of distance between the wiring patterns 80-1 and the wiring patterns 80-3 is set to larger than one pitch of the wiring-pattern arrangement to reduce the cross talk occurring between these lines.

Figure 29:
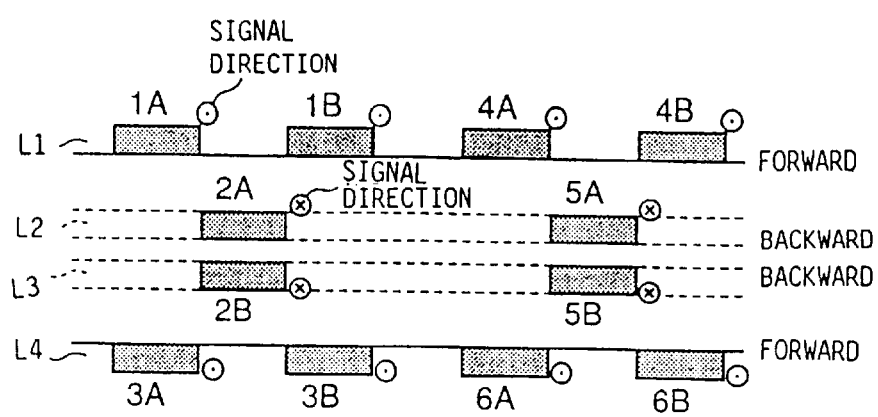
FIG. 29 shows a configuration example of the wiring patterns connecting input and output connectors and the matrix switch parts.

FIG. 29 shows a configuration example of the wiring patterns connecting the input and output connectors and the matrix switch parts. The configuration example shows a case where the input signal wiring patterns and the output signal wiring patterns are close to each other. In this case, for connection between the input connector 76-1 and the matrix switch parts 74-1, 74-2, the first group of wiring patterns (wiring patterns 92, 94) in the first and fourth wiring layers are used, and for connection between the output connector 76-2 and the matrix switch parts 74-1, 74-2, the second group of wiring patterns (wiring patterns 96, 98) in the second and third wiring layers are used. Therefore, the cross talk occurring where the opposite direction signals are transmitted may be reduced. Further, in the above discussed example, the first group of wiring patterns and the second group of wiring patterns may reversely be used for the input and output signals.

Figure 30:
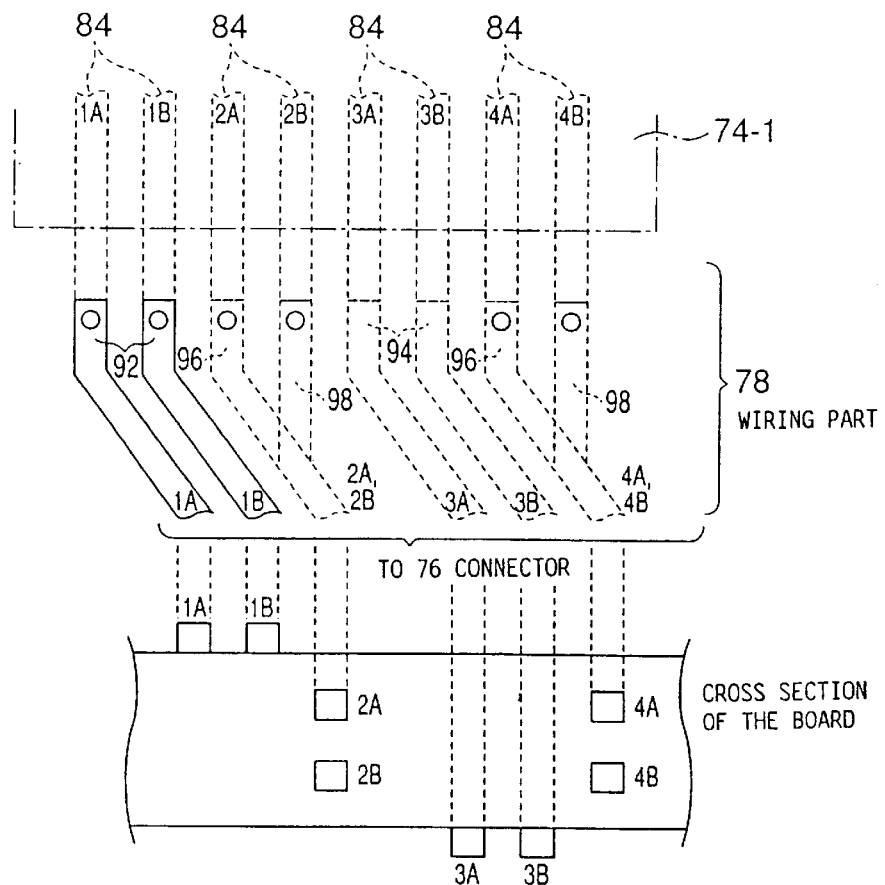
FIG. 30 is an illustration for indicating a wiring configuration from the matrix switch part to the input-and-output connector.

FIG. 30 illustrates a wiring configuration from the matrix switch part to the input-and-output connector. FIG. 30 shows, for example, the wiring configuration from the wiring patterns 84 of the fourth wiring layer in the matrix switch part 74-1 to the output connector 76-2. In the embodiment, a pair of wiring patterns 1A and 1B in the wiring patterns 84 are connected to the wiring patterns 92 of the first wiring layer in the wiring part 78 (first group of wiring patterns) through through holes. A pair of wiring patterns 2A and 2B are connected to the wiring patterns 96, 98 of the second and third wiring layers in the wiring part 78 (second group of wiring patterns) through through holes. A pair of wiring patterns 3A and 3B are connected to the wiring patterns 94 of the fourth wiring layer in the wiring part 78 (first group of wiring patterns). A pair of wiring patterns 4A and 4B are connected to the wiring patterns 96, 98 of the second and third wiring layers in the wiring part 78 (second group of wiring patterns) through through holes.

In this way, in the wiring configuration of the wiring parts 78, the adjoining groups of wiring patterns are formed in different wiring layers. Therefore, cross talk between two lines using the adjoining groups of wiring patterns may be reduced.

Figure 31:
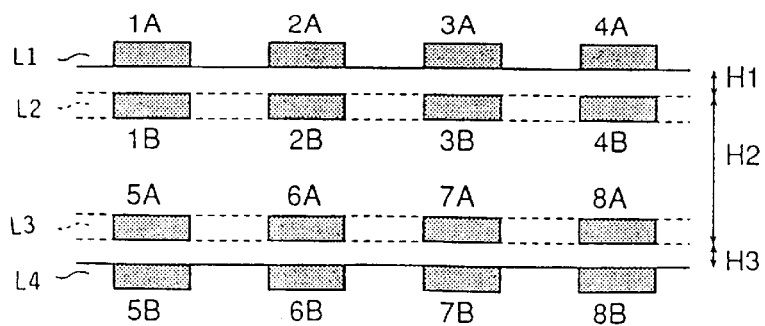
FIG. 31 shows another wiring-pattern configuration example of the wiring part in the matrix switch board shown in FIG. 15A.

FIG. 31 shows another wiring-pattern configuration example of the wiring part in the matrix switch board shown in FIG. 15A. In the above-discussed configuration example of the wiring patterns of the wiring parts 78, for each of the first and fourth wiring layers, a pair of wiring patterns 92 or a pair of wiring patterns 94 are repeatedly formed in a horizontal direction, and for the second and third wiring layers, a pair of the upper-and-lower-side wiring patterns 96, 98 are formed in a vertical direction. On the contrary, in the configuration example of FIG. 31, for the first and second wiring layers and for the third and fourth wiring layers, a pair of upper-and-lower-side wiring patterns are formed in a vertical direction.

In the configuration example of FIG. 31, an interval of distance H1, H3 between the pair of upper-and-lower-side wiring patterns is less than an interval of distance H2 between two pairs of wiring patterns formed in different wiring layers. Such configuration may reduce cross talk occurring between a pair of wiring patterns and the surrounding pairs of wiring patterns. Further, such configuration is applicable for a multilayer printed board (at least more than three layers).

Next, a description will be given of another embodiment of the matrix switch board according to the present invention.

FIG. 32A and FIG. 32B show another embodiment of the matrix switch board according to the present invention. FIG. 32A shows a top plan view of the matrix switch board, and FIG. 32B shows a side view thereof. A matrix switch board 110 shown in FIG. 32A has mounted therein three reference pins 116 in addition to a matrix switch part 112 and input-and-output parts 114. The reference pin 116 has substantially the same height as that of the connection pin 30. A robot (not shown) for inserting the connection pin 30 may determine a position of a designated through holes by directly contacting the reference pins 116.

Further, a diameter of a hole in the matrix switch board 110 where the reference pin 116 is inserted is set to be substantially the same as that of the through hole in the matrix switch part 112. Therefore, in a step of manufacturing the matrix switch board 110, the through holes and the holes for the reference pins 116 may be formed using the same drill. Accordingly, for forming the through holes and the holes for the reference pins 116, it is unnecessary to change the drill, and, thus, manufacturing efficiency of the matrix switch board may be improved.

FIG. 33 shows another embodiment of the matrix switch board according to the present invention. In the previously-discussed matrix switch board 70 shown in FIG. 15A, the input-and-output connector 76 is provided on the back end side of the matrix switch board 70. On the other hand, in a matrix switch board 120 shown in FIG. 33, input-and-output connectors 122 and 124 are provided in a longer side of the matrix switch board 120. In this configuration, connection wires between the matrix switch parts 126-1, 126-2 and the input-and-output connectors 122, 124 may be shorter and may easily be formed.

Figure 34:
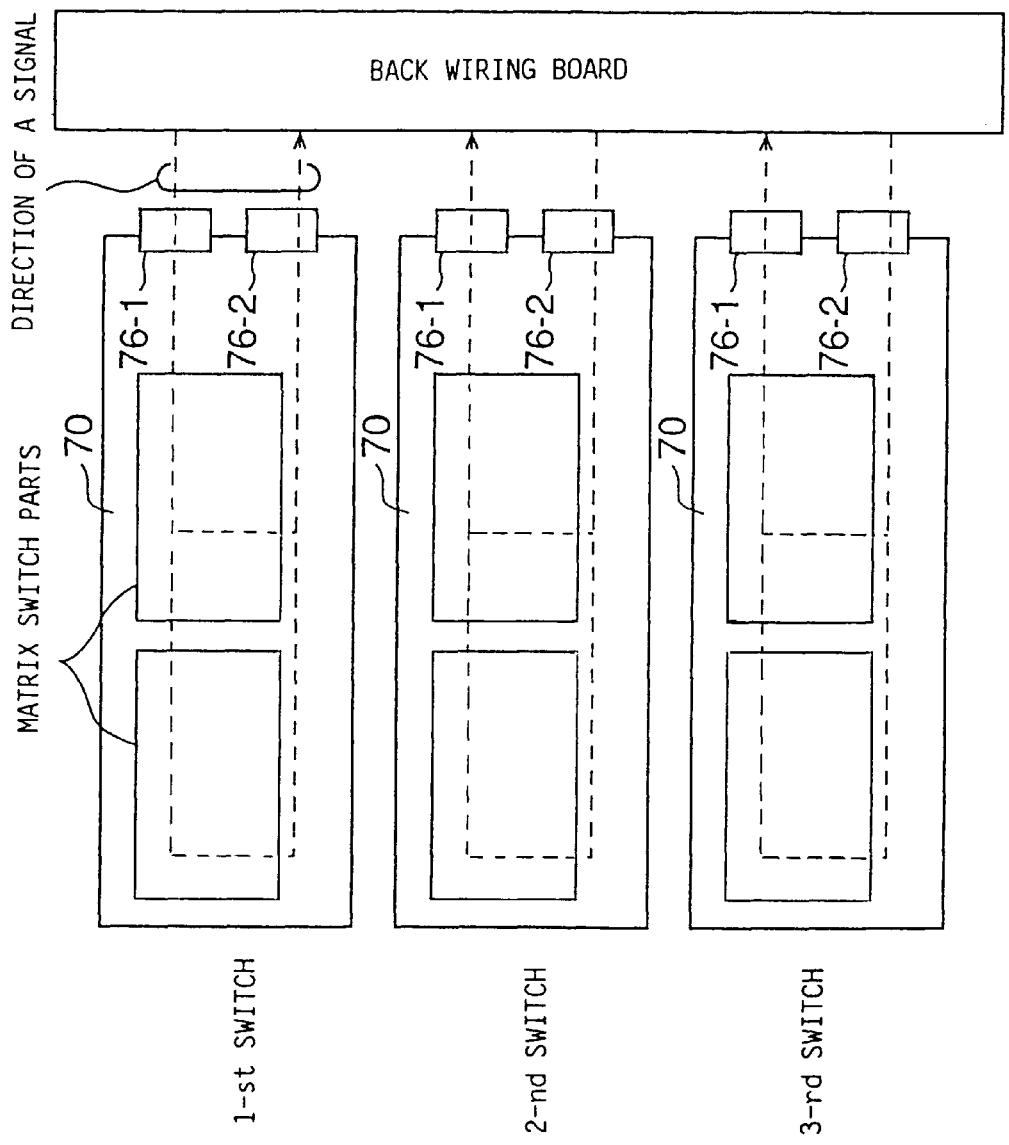
FIG. 34 is an illustration for explaining a mounting structure of the matrix switch boards to equipment according to the present invention.

FIG. 34 shows an illustration for explaining a mounting structure of the matrix switch boards to the equipment according to the present invention. As discussed previously by referring to FIG. 10, in practical use, the matrix switch boards are used in the network-structure manner to reduce the total number of cross points. In this case, a process connecting between the switching system and the subscriber is carried out through first-switch, second-switch, and third-switch matrix switch boards 70.

FIG. 34 shows the mounting structure where the first-switch, second-switch, and the third-switch matrix switch boards 70 are mounted to a back wiring board of the automatic MDF (not shown). In the mounting structure, in the first-switch matrix switch board 70, the connector 76-1 is used for an input connector, and the connector 76-2 is used for an output connector. On the other hand, in the second-switch and third-switch matrix switch boards 70, the connector 76-1 is used for the output connector, and the connector 76-2 is used for the input connector.

In the above case, a signal direction in the first-switch matrix switch board 70 is opposite of that in the second-switch and third-switch matrix switch boards 70. In such a mounting structure, the same matrix switch boards 70 may be used for the first-switch, second-switch, and third-switch matrix switch boards in the network structure.

Figure 35:
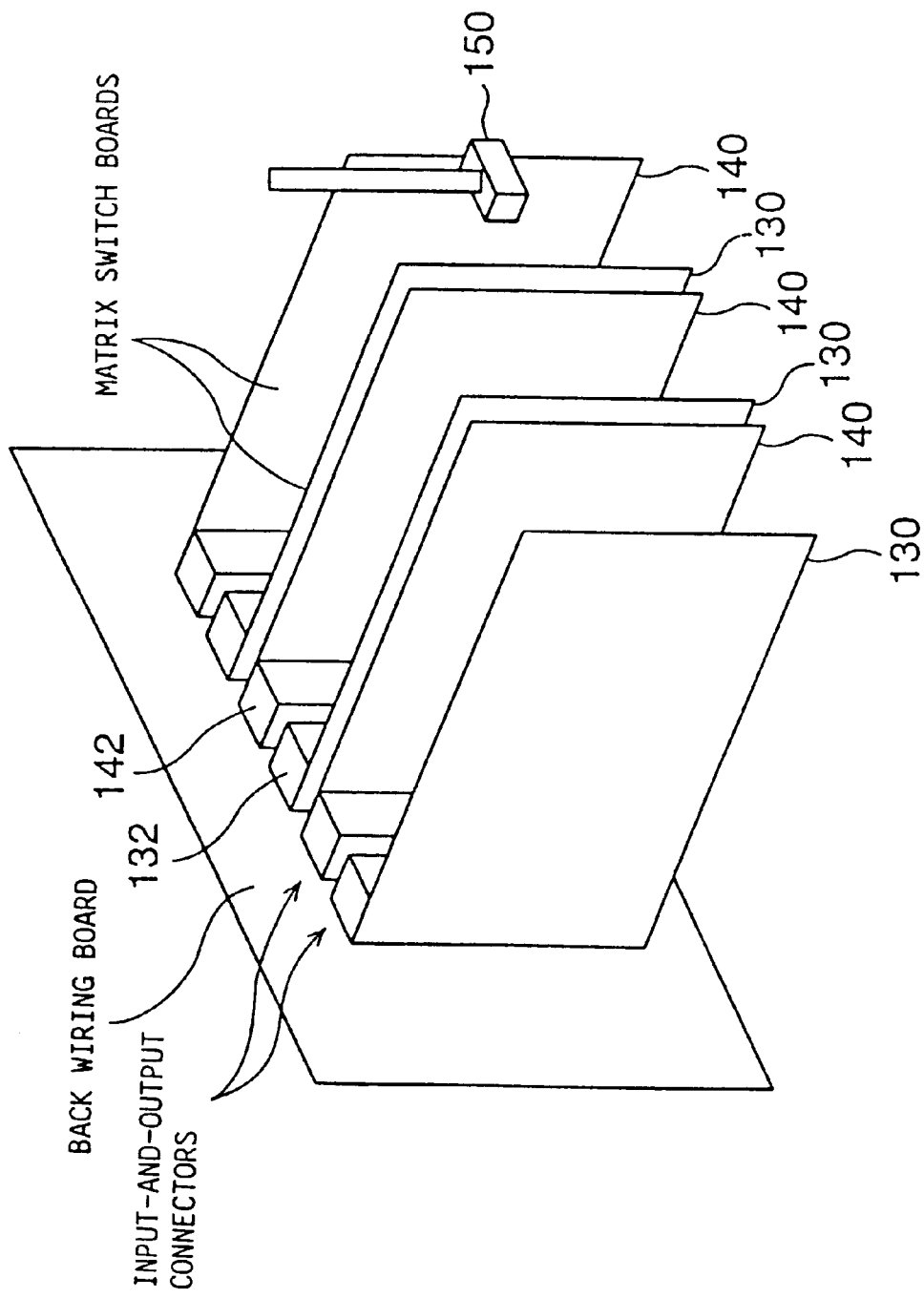
FIG. 35 shows an embodiment of the mounting structure of the matrix switch boards to the equipment.

FIG. 35 shows an embodiment of the mounting structure of the matrix switch boards to the equipment. FIG. 35 shows a case where a plurality of matrix switch boards 130, 140 is mounted to the back wiring board of the automatic MDF. In the matrix switch board 130, an input-and-output connector 132 is provided in the back end part of the front side of the board 130, and in the matrix switch board 140, an input-and-output connector 142 is provided: in the back end part of the back side of the board 140.

The matrix switch boards 130, 140 are mounted to the back wiring board so as to sandwich a space where a connection-pin inserting-and-extracting mechanism 150 is movable. In this case, for example, the inserting-and-extracting mechanism 150 can insert the connection pin into the front side of the matrix switch board 130 and into the back side of the matrix switch board 140 without changing a position of the mechanism 150 to on the next board. Therefore, there are spaces where the inserting-and-extracting mechanism 150 needs to move between the matrix switch boards 130, 140. In these spaces, the matrix switch boards 130 and 140 are mounted to the back wiring board so as to be close to each other. By such a mounting structure, a number of matrix switch boards may be efficiently mounted to the equipment.

Figure 36:
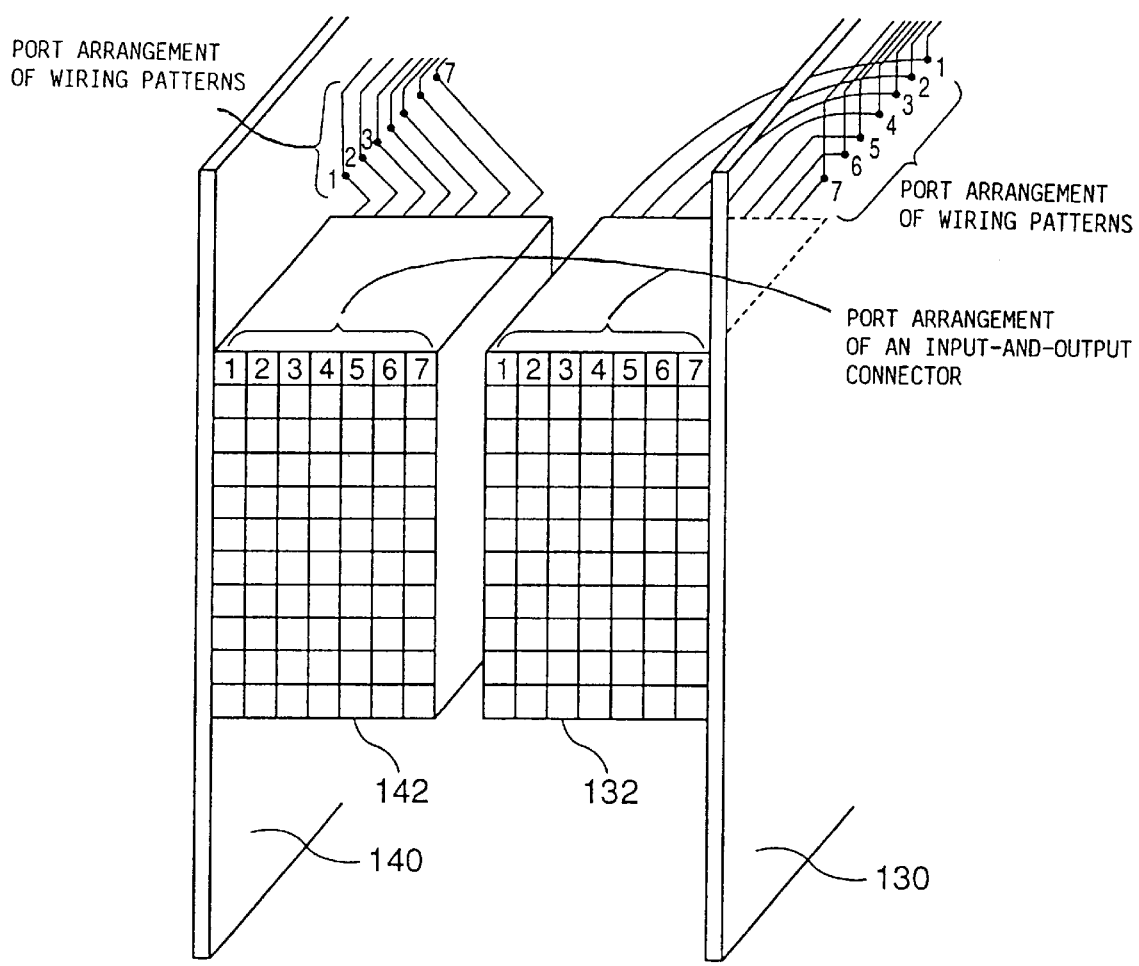
FIG. 36 shows an illustration for explaining a port arrangement of an input-and-output connector and a port arrangement of wiring patterns in the matrix switch board shown in FIG. 35.

FIG. 36 shows an illustration for explaining a port arrangement of the input-and-output connector and a port arrangement of the wiring patterns in the matrix switch board shown in FIG. 35. FIG. 36 is a drawing in which the input-and-output connectors 132, 142 shown in FIG. 35 are viewed from a back side of the back wiring board. In the matrix switch boards 130, 140, the input-and-output connectors 132, 142 are constructed so as to have the same port arrangement as each other when these connectors are viewed from the back side of the back wiring board.

For example, in FIG. 36, port numbers 1, 2, 3, . . . 7 of the input-and-output connector 142 in the matrix switch board 140 are arranged in a right direction from the board 140, and port numbers 1, 2, 3, . . . 7 of the input-and-output connector 132 in the matrix switch board 130 are arranged in a right direction toward the board 130. Further, port numbers 1, 2, 3, . . . 7 of the wiring patterns in the matrix switch board 140 are arranged in opposite direction of port numbers 1, 2, 3, . . . 7 of the wiring patterns in the matrix switch board 130.

In this configuration, the port numbers 1, 2, 3, . . . 7 of the input-and-output connector 142 are respectively connected to the port numbers 1, 2, 3, . . . 7 of the wiring patterns in the matrix switch board 140. Also, the port numbers 1, 2, 3, . . . 7 of the input-and-output connector 132 are respectively connected to the port numbers 1, 2, 3, . . . 7 of the wiring patterns in the matrix switch board 130.

In this way, by changing a connection relationship between the input-and-output connector and the wiring patterns in the matrix switch boards 130 and 140, the same port arrangement of the input-and-output connector which is viewed from the back wiring board may be provided in both the matrix switch boards 130 and 140. Therefore, a configuration of the back wiring board may be simplified.

Figure 37:
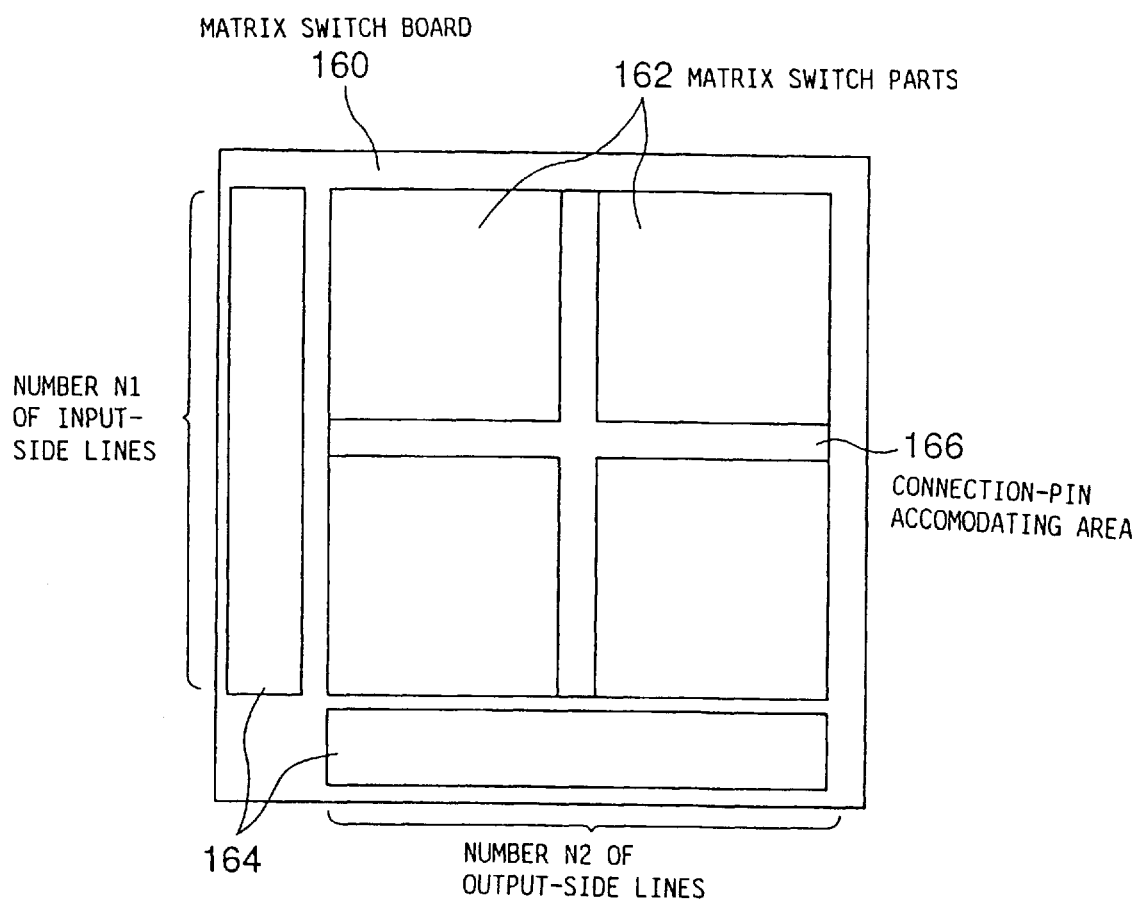
FIG. 37 shows another embodiment of the matrix switch board according to the present invention.

FIG. 37 shows another embodiment of the matrix switch board according to the present invention. In a matrix switch board 160 shown in FIG. 37, in addition to a matrix switch part 162 and an input-and-output part 164, a connection-pin accommodating area 166 for accommodating a number of connection pins is provided in the matrix switch part 162. The connection-pin accommodating area 166 is formed in a cross-shape manner so as to substantially divide the matrix switch part 162 into four areas. Wiring patterns formed in the connection-pin accommodating area 166 are electrically isolated from the wiring patterns in the matrix switch part 162.

In this way, by providing the connection-pin accommodating area 166 in a cross-shaped manner to the matrix switch part 162, the through holes where the connection pin will be inserted or extracted becomes close to the connection-pin accommodating area 166, and, thus, an inserting-and-extracting operation of the connection pin may be efficiently carried out.

Further, in this case, when the number of input-side lines of the matrix switch part 162 is N1, and the number of output-side lines thereof is N2, the number of connection pins accommodated in the connection-pin accommodating area 166 may be less one of the number N1 of input-side lines and the number N2 of output-side lines. Therefore, the connection pins are prevented from excessively being supplied to the accommodating area 166.

Further, the present invention is not limited to these embodiments, but other variations and modifications may be made without departing from the scope of the present invention.

What is claimed is:

1. A method of manufacturing a matrix switch board having a front surface and a back surface, said board being used for selectively connecting and disconnecting a specified line via a removable pin, said method comprising the steps of:

(a) forming through holes at predetermined positions where first and second wiring patterns will be formed on a board on which conductive layers are formed on the front and back surfaces of the board, wherein said through holes have side walls that extend from the front surface to the back surface;

(b) patterning said conductive layers formed on the front and back surfaces of the board by using a resist to produce said first and second wiring patterns, respectively, on the front and back surfaces, but not on the side walls of the through holes, which wiring patterns cross each other in respective planes;

(c) etching said board patterned in the step (b); and (d) plating said first and second wiring patterns, and not the side walls, to form parts of the respective wiring patterns overhanging in a substantially center axis direction of the through hole.

2. The method as claimed in claim 1, wherein said step (b) comprises a step of patterning said first and second wiring patterns so that a part of the wiring patterns where no through hole is formed is thinner than a part of the wiring patterns where said through holes are formed.

* * * * *